US009876102B2

(12) United States Patent
Teo et al.

(10) Patent No.: US 9,876,102 B2
(45) Date of Patent: Jan. 23, 2018

(54) SEMICONDUCTOR DEVICE WITH MULTIPLE CARRIER CHANNELS

(71) Applicant: Mitsubishi Electric Research Laboratories, Inc., Cambridge, MA (US)

(72) Inventors: Koon Hoo Teo, Lexington, MA (US); Yuhao Zhang, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 67 days.

(21) Appl. No.: 14/842,856

(22) Filed: Sep. 2, 2015

(65) Prior Publication Data

US 2017/0018639 A1  Jan. 19, 2017

Related U.S. Application Data

(60) Provisional application No. 62/193,677, filed on Jul. 17, 2015.

(51) Int. Cl.
*H01L 29/66* (2006.01)
*H01L 29/778* (2006.01)
(Continued)

(52) U.S. Cl.
CPC ...... *H01L 29/7787* (2013.01); *H01L 21/8258* (2013.01); *H01L 27/0688* (2013.01);
(Continued)

(58) Field of Classification Search
CPC ......... H01L 29/66431; H01L 29/66462; H01L 29/778; H01L 29/7781; H01L 29/7782;
(Continued)

(56) References Cited

U.S. PATENT DOCUMENTS 5,091,759 A * 2/1992 Shih .................... H01L 29/7783
257/192
5,142,349 A   8/1992 Zhu et al.
(Continued)

FOREIGN PATENT DOCUMENTS

EP        0519830 A2    12/1992
GB        2504613 A  *  2/2014  ......... H01L 21/8258
WO     2015083887 A1    6/2015

OTHER PUBLICATIONS

Ueda et al. Diamond FET Using High Quality Polycrystaloline Diamond with FR of 45 GHz and fmax of 120 GHz, IEEE Electron Device Letters. vol. 27, No. 7, Jul. 2006. pp. 570-572.
(Continued)

*Primary Examiner* — Davienne Monbleau
*Assistant Examiner* — Leslie Pilar Cruz
(74) *Attorney, Agent, or Firm* — Gene Vinokur; James McAleenan; Hironori Tsukamoto

(57) ABSTRACT

A semiconductor device includes a layered structure forming multiple carrier channels including at least one n-type channel formed in a first layer made of a first material and at least one p-type channel formed in a second layer made of a second material and a set of electrodes for providing and controlling carrier charge in the carrier channels. The first material is different than the second material, and the first and the second materials are selected such that the n-type channel and the p-type channel have comparable switching frequency and current capability.

18 Claims, 22 Drawing Sheets

(51) Int. Cl.
- *H01L 29/205* (2006.01)
- *H01L 21/8258* (2006.01)
- *H01L 27/06* (2006.01)
- *H01L 27/085* (2006.01)
- *H01L 27/092* (2006.01)
- *H01L 27/02* (2006.01)

(52) U.S. Cl.
CPC .......... *H01L 27/085* (2013.01); *H01L 27/092* (2013.01); *H01L 29/205* (2013.01); *H01L 29/66462* (2013.01); *H01L 27/0207* (2013.01)

(58) Field of Classification Search
CPC ............. H01L 29/7783; H01L 29/7787; H01L 29/7788; H01L 29/7789
See application file for complete search history.

(56) References Cited

U.S. PATENT DOCUMENTS

| | | | |
|---|---|---|---|
| 6,100,549 A | 8/2000 | Weitzel et al. | |
| 6,777,278 B2 | 8/2004 | Smith et al. | |
| 7,098,490 B2 | 8/2006 | Micovic et al. | |
| 7,544,963 B2 | 1/2009 | Saxler et al. | |
| 7,838,905 B2 | 11/2010 | Brar et al. | |
| 7,842,134 B2 | 11/2010 | Whitehead et al. | |
| 7,851,857 B2 | 12/2010 | Fu et al. | |
| 7,888,171 B2 | 2/2011 | Korenstein et al. | |
| 7,892,881 B2 | 2/2011 | Chen et al. | |
| 8,193,562 B2 | 5/2012 | Suh et al. | |
| 8,435,833 B2 | 5/2013 | Linares et al. | |
| 8,575,657 B2 | 11/2013 | Gambin et al. | |
| 8,759,879 B1 | 6/2014 | Tipirneni et al. | |
| 9,035,355 B2 | 5/2015 | Ostermaier et al. | |
| 2002/0018565 A1 | 12/2002 | Fahimulla et al. | |
| 2005/0127373 A1 | 6/2005 | Yokota et al. | |
| 2008/0121897 A1 | 5/2008 | LaRoche et al. | |
| 2008/0296618 A1 | 12/2008 | Suh et al. | |
| 2013/0105812 A1 | 5/2013 | Ishigaki et al. | |
| 2013/0153923 A1 | 6/2013 | Decoutere | |
| 2013/0221409 A1 | 8/2013 | Nakajima et al. | |
| 2014/0091310 A1* | 4/2014 | Jeon | H01L 29/2003 257/76 |
| 2014/0091366 A1* | 4/2014 | Jeon | H01L 21/8252 257/195 |
| 2014/0264273 A1 | 9/2014 | Howell et al. | |

OTHER PUBLICATIONS

R. S. Pengelly, S. M. Wood, J. W. Milligan, S. T. Sheppard, and W. L. Pribble, "A Review of GaN on SiC High Electron-Mobility Power Transistors and MMICs," IEEE Transactions on Microwave Theory and Techniques, vol. 60, No. 6, pp. 1764-1783, Jun. 2012.

* cited by examiner

SEMICONDUCTOR DEVICE WITH MULTIPLE CARRIER CHANNELS

RELATED APPLICATION

This application claims priority from a provisional application 62/193,677 filed on Jul. 17, 2015 and incorporated herein by reference.

FIELD OF THE INVENTION

The present invention relates generally to semiconductor device, and more particularly to semiconductor devices with multiple carrier channels.

BACKGROUND OF THE INVENTION

Semiconductor devices play a significant role in solving the energy challenges. Specifically, nitride power transistors have great potential in the application of advanced transportation systems, more robust energy delivery networks and many new revolutionary approaches to high-efficiency electricity generation and conversion. Those systems rely on very efficient converters to step-up or step-down electric voltages. Nowadays, these devices are mainly made of silicon (Si). However, the limited breakdown voltage and frequency response of Si, and its higher resistance make the commercial devices and circuits currently available very bulky, heavy and inappropriate for future power applications. As an alternative, gallium nitride (GaN) devices have achieved record combination of high-voltages, high frequency response and low on-resistances for power applications.

Currently, GaN power devices, such as the GaN-based high electron mobility transistors (HEMTs), are regarded as one of the most promising candidates for high-power, high-voltage and high frequency applications. GaN HEMTs, with a two-dimensional-electron gas (2DEG) channel, have achieved up to 10 times higher power density of GaAs HEMTs with much larger breakdown voltage ($V_B$) and current density, as well as a high cut-off frequency of over 400 GHz. State-of-the-art power levels have been demonstrated on SiC substrates with total output powers of 800 W at 2.9 GHz and over 500 W at 3.5 GHz.

There are many circuit applications in digital, microwave and power electronics requiring monolithic or single-device integration of n-channel, such as the 2DEG channel, and p-channel, such as the 2DHG channel. The structure of the nitride materials, such as GaN, can enable a high-speed and high-current n-channel. However, performance of the p-channel of these materials is much inferior, which inhibited the realization of the circuit applications. For example, the effective hole mass in GaN is much higher than the electron mass. The state-of-the-art GaN-based 2DHG p-type channel can only have a mobility of 10-40 $cm^2$/Vs and maximum output current of ~30-40 mA/mm. In comparison, the n-type 2DEG channel has a mobility of over 2000 $cm^2$/Vs and maximum output current of over 1-2 A/mm) To that end, current efforts to create 2DHG in GaN-based heterostructrues to enable p-channel GaN-based HFETs are largely unsuccessful.

SUMMARY OF THE INVENTION

It is an objective of some embodiments of an invention to provide a semiconductor device with multiple carrier channels of different types but comparable switching speed and current capability. It is another object of some embodiments to provide such a semiconductor device forming multiple carrier channels including at least one n-type channel layer and at least one p-type channel of comparable switching speed and current capability. It is another object of one embodiment to provide such a semiconductor device that both types of channels have switching frequency higher than 10 GHz. It is another object of one embodiment to provide such a semiconductor device that both types of channels have maximum current higher than 100 mA/mm. It is another object of one embodiment to provide such a semiconductor device that both types of channels have maximum current higher than 300 mA/mm.

Some embodiments are based on a realization that instead of trying to make different types of carrier channels of comparable switching speed and current capability in the same type of material, it is advantageous to select and integrate different materials with properties enabling comparable switching speed and current capability for different types of the carrier channels in a single semiconductor device. In such a manner, a layered structure having multiple carrier channels can be fabricated including at least one n-type channel formed in a first layer and at least one p-type channel formed in a second layer, in which material of the first layer is different from material of the second layer and both materials are selected such that have switching frequency higher than 10 GHz and/or maximum current higher than 300 mA/mm.

For example, one embodiment is based on recognition that diamond can be used to form high-speed and high-current two-dimensional-hole gas (2DHG) p-channels. A breakthrough in the development of diamond-based device includes the identification of a p-type surface conductive channel found on the highly polar hydrogen (H)-terminated diamond surface. Experiments show that an adsorbed layer from the atmosphere on the H-diamond surface induces this surface conductivity by receiving electrons from the diamond valence band, giving rise to a 2DHG channel within the diamond. To that end, some embodiments use diamond 2DHG p-channel to replace inferior GaN p-channels, for the integration n-channel and p-channel applications. For example, diamond 2DHG p-channel can be integrated with GaN two-dimensional-electron gas (2DEG) n-channel.

Accordingly, one embodiment of an invention discloses a semiconductor device including a layered structure forming multiple carrier channels including at least one n-type channel formed in a first layer made of a first material and at least one p-type channel formed in a second layer made of a second material, wherein the first material is different than the second material, and wherein the first and the second materials are selected such that the n-type channel and the p-type channel have comparable switching frequency and current capability; and a set of electrodes for providing and controlling carrier charge in the carrier channels.

Another embodiment of the invention discloses a semiconductor device including a layered structure forming multiple carrier channels including at least one n-type channel formed in a first layer made of a first material including gallium nitride (GaN) or gallium arsenide (GaAs) such that the n-type channel is a two-dimensional-electron gas (2DEG) channel formed with electrons of the GaN or GaAs, and at least one p-type channel formed in a second layer made of a second material including diamond such that the p-type channel is a two-dimensional-hole gas (2DHG) channel formed with holes of the diamond; and a set of electrodes for providing and controlling carrier charge in the carrier channels.

Yet another embodiment of the invention discloses a method for making a semiconductor device. The method includes forming a layered structure with multiple carrier channels including at least one n-type channel formed in a first layer made of a first material including gallium nitride (GaN) or gallium arsenide (GaAs) such that the n-type channel is a two-dimensional-electron gas (2DEG) channel formed with electrons of the GaN or GaAs, and at least one p-type channel formed in a second layer made of a second material including diamond such that the p-type channel is a two-dimensional-hole gas (2DHG) channel formed with electrons of the diamond; forming set of electrodes for providing and controlling carrier charge in the carrier channels; and connecting the electrodes such that at least one electrode from the set of electrodes is a common electrode connected to all carrier channels.

DETAILED DESCRIPTION OF THE PREFERRED EMBODIMENTS

Various embodiments of the invention disclose a semiconductor device having multiple carrier channels including at least one p-channel and at least one n-channel of comparable switching speed and current capability. For example, different embodiments can be applied to methods and systems for manufacturing semiconductor devices with multiple two-dimensional-electron (2DEG) channels and H-diamond two-dimensional-hole (2DHG) channels. The methods and techniques can be applied to a variety of n-channels, including but not limiting to the channels of junction FETs, metal-oxide-semiconductor (MOS) FETs, heterostructure FETs, tunneling effect FETs and various two-terminal devices. Embodiments that use 2DEG channels in heterostructures as n-channels and 2DHG channels in diamond as p-channels are described herein. Examples of the embodiments with 2DEG channels and 2DHG channels, include monolithic integration of 2DEG channels and 2DHG channels in a semiconductor device; semiconductor transistors with 2DEG & 2DHG channels and common electrodes for multiple channels; and semiconductor diodes with 2DEG channels and 2DHG channels.

Figure 1:
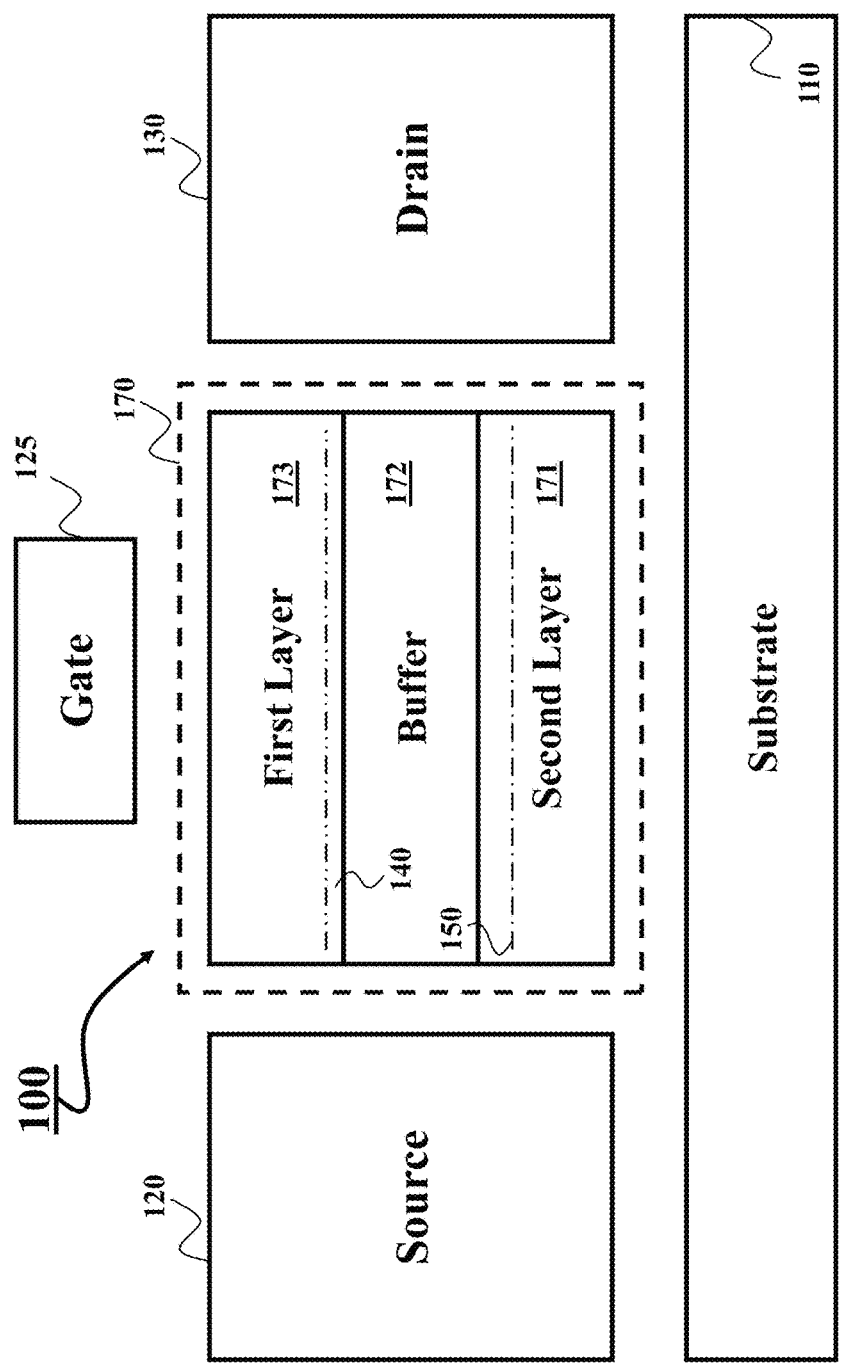
FIG. 1 is a cross-sectional diagram of a semiconductor device 100 according to one embodiment of the invention.

FIG. 1 shows a simplified cross-sectional diagram of a semiconductor device 100 according to one embodiment of the invention. In this embodiment, the semiconductor device includes a layered structure 170 forming multiple carrier channels 140 and 150. The multiple carrier channels include channels of different type. For example, the layer structure 170 including at least one n-type channel 140 formed in a first layer 173 and at least one p-type channel 150 formed in a second layer 171. The first and the second layers can be separated by a buffer layer 172. The semiconductor device can also include other layers, e.g., a substrate 110.

Some embodiments are based on a realization that instead of trying to make different types of carrier channels of comparable switching frequency and current capability in the same type of material, it is advantageous to select and integrate different materials with properties enabling comparable switching frequency and current capability for different types of the carrier channels in a single semiconductor device.

For example, the first layer 173 is made of a first material. The second layer 171 is made of a second material. The first material of the first layer 173 is different than the second material of the second layer 171. The first and the second materials are selected such that both channels have switching frequency higher than 10 GHz and maximum current higher than 300 mA/mm.

For example, in one embodiment, the first material includes gallium nitride (GaN) such that the n-type channel is a two-dimensional-electron gas (2DEG) channel formed with electrons of the GaN. The second material includes diamond such that the p-type channel is a two-dimensional-hole gas (2DHG) channel formed with holes of the diamond. GaN is cheaper material than the diamond, but enables sufficient electron mobility for n-type channels. Diamond is more expensive but has advantageous mobility and current mobility for p-type channels over p-type channels made in GaN. In such a manner, both types of channels have the switching frequency higher than 10 GHz and maximum current higher than 300 mA/mm, while reducing the overall cost of semiconductor device.

In various embodiments, the first material and the second material can include different combinations of such materials as compound semiconductors, silicon, germanium, organic semiconductors, diamond, carbon nanotube, graphene, molybdenum disulfide, boron nitride. For example, n-type channel can be formed by one or combination of a p-n junction, a metal-semiconductor structure, a metal-oxide-semiconductor structure, a tunneling structure, a surface quantum well and a heterostructure. For example, the p-type channel can be formed by one or combination of a surface hydrogenation and a delta-doping.

In the layered structure of the semiconductor device, each carrier channel is formed in a layer made of material. In fact, the carrier channel can be formed on a surface and/or inside the bulk of the material. As used herein, the carrier channel formed in the material means that the carrier channel is formed using carriers of that material. For example, in the embodiments where the first material includes GaN, the n-type channel is formed with the electrons of the GaN. In the embodiments where the second material includes diamond, the p-type channel is formed with the holes of the diamond.

The semiconductor device 100 also includes a set of electrodes for providing and controlling carrier charge in the carrier channels. For example, the set of electrodes can include at least one source electrode 120 transmitting an electronic charge through the carrier channels, at least one drain electrode 130 receiving the electronic charge and at least one gate electrode 125 operatively connected to the layered structure 170 for controlling a conduction of the carrier charge.

In some embodiments, at least one electrode from the set of electrodes is a common electrode connected to all carrier channels. For example, the common electrode can be a source electrode 120 or a drain electrode 130 for all carrier channels. In alternative embodiment, the common electrode can be a source electrode for one carrier channel 140 or 150 and a drain electrode for another carrier channel 150 or 140.

In some embodiments, the common electrode is a gate electrode 125 controlling carrier charges in the multiple carrier channels. In one embodiment, the gate electrode has multiple gate fingers of different lengths penetrating the layered structure to reach and control corresponding carrier channels at the different depths, as described in more details below.

Monolithic Integration of Carrier Channels in a Semiconductor Device

Figure 2:
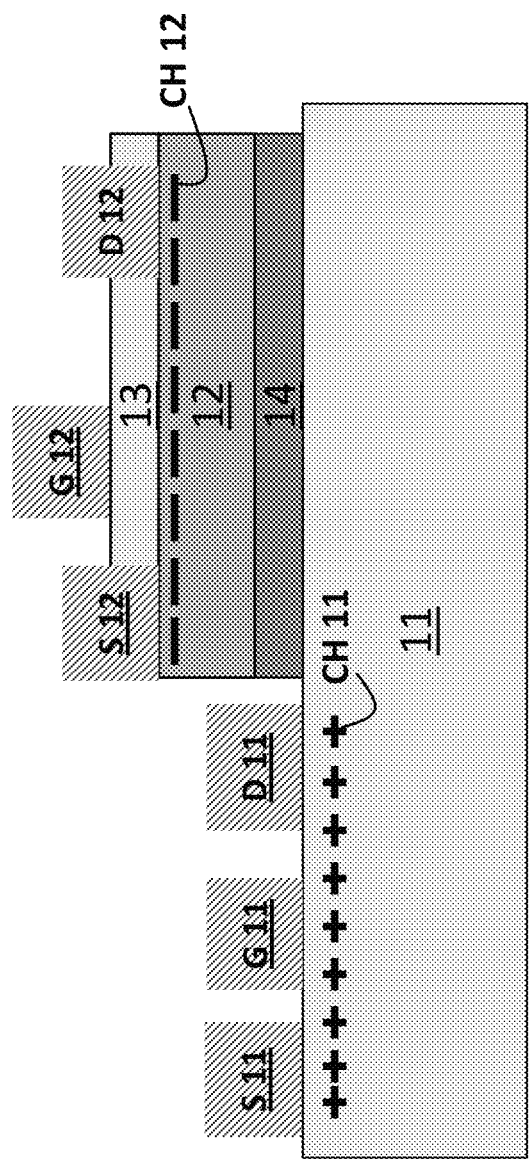
FIG. 2 and FIG. 3 are cross-sectional diagrams of a semiconductor device with integrated p-channel and n-channel according to different embodiments of the invention.

FIG. 2 shows a cross-sectional diagram of a semiconductor device with integrated p-channel and n-channel according to one embodiment of the invention. The layer 11 includes diamond for forming 2DHG channel CH11. According to some embodiments, various methods can be adopted for the formation of diamond layer, including but not limiting to a chemical vapor deposition (CVD), a Metal-Organic Chemical Vapor Deposition (MOCVD), a DC plasma CVD, microwave plasma deposition system. The layer 11 can be undoped or can be intentionally doped with either n-type dopants or p-type dopants, including but not limiting to boron (B), nitrogen (N) and phosphorus (P).

At least a part of the layer 11 forms a 2DHG channel CH 11. In some implementations, the channel CH 11 is formed on a part of the surface of the layer 11, i.e., another part of the surface does not form the 2DHG channel. The 2DHG channels can be formed by various methods, including but not limiting to surface hydrogenation and delta-doping near the surface. Some parts of the surface can be oxygenated or partially etched for device channel isolation.

A semiconductor region 14 is disposed on the diamond layer 11 but does not cover the hydrogenated surface or the said 2DHG channel CH 11. Region 14 can include single layer or multiple buffer layers, including adhesion, nucleation, transition and other layers for promoting the growth of the compound semiconductor epitaxial layers on lattice-mismatched diamond. The materials of region 14 can be dielectrics such as $SiN_x$, $Al_2O_3$, $SiO_2$, binary III-V materials such as AlN or GaN, ternary III-V materials such as InGaN and AlGaN, and quaternary III-V materials such as AlInGaN. In some embodiments, the transition layers in region 14 can be superlattice structure and compositionally-graded layers.

A compound semiconductor layer 12 is disposed on the semiconductor region 14. In some embodiments, the materials of layer 12 can be III-nitride or III-arsenide materials. The layer 12 can be n-type doped, unintentionally doped, or p-type doped. A compound semiconductor layer 13 is disposed on the compound semiconductor layer 12. The material of layer 13 has a different lattice constant compared to material of layer 12. In a specific embodiment, materials of layer 13 and layer 12 can be one or combination of indium aluminium gallium nitride InAlGaN and gallium nitride (GaN), aluminium gallium nitride (AlGaN) and GaN, or indium gallium nitride (InGaN) and GaN. In this specific embodiment, a 2DEG channel CH 12 is formed at the heterostructure of layer 12 and layer 13.

As shown in FIG. 2, S11, G11, D11 and S12, G12, D12 are the source electrode, gate electrode and drain electrode for the channel CH 11 and CH 12, respectively. The gate stacks for the channel CH 11 and CH 12 can be either depletion-mode (D-mode) or enhancement-mode (E-mode). In some embodiment, the gate stacks of CH 11 and CH 12 are intrinsically D-mode, meaning the threshold voltage (Vth) of CH 11 and CH 12 is positive and negative, respectively. In some specific embodiments, various methods can be used to transform the D-mode gate stack into E-mode for CH 11 and CH 12. For example, one embodiment partially etches region 11 and layer 13 below the channels CH 11 and CH 12. Alternative embodiment implants positive or negative ions into the region 11 and layer 13 below the CH 11 and CH 12, respectively, with the ions including but not limiting to fluorine, chlorine, boron, magnesium. Another embodiment inserts a n-type semiconductor layer between the said gate G11 and the said channel CH 11, or a p-type semiconductor layer between the said gate G12 and the said channel CH 12.

Figure 3:
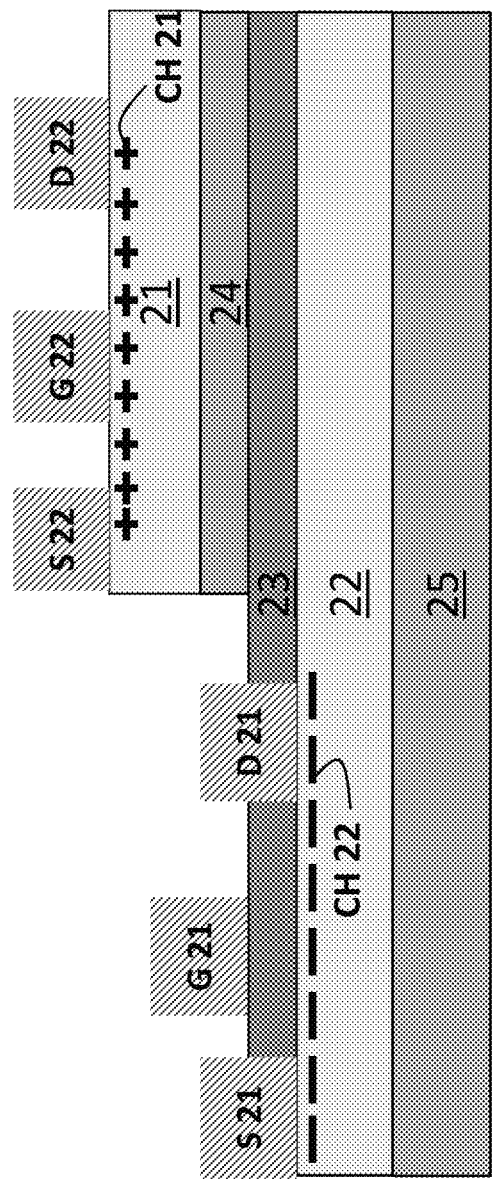

FIG. 3 shows a cross-sectional diagram of a semiconductor device with integrated p-channel and n-channel according to one embodiment of the invention.

The regions 21, 22, 23 and 24, the channels CH 21 and CH 22, and the electrodes S21, S22, G21, G22, D21, D22 can be formed in a way similar to the regions 11, 12, 13 and 14, channels CH 11 and CH 12, and the electrodes S11, S12, G11, G12, D11, D12 in the embodiment shown in FIG. 2.

In some embodiments, the diamond region 21 can be monocrystalline, polycrystalline and nanocrystalline. In some embodiments, the region 24 can be removed if the thickness of the region 21 is less than a threshold. The region 25 can include a single or multiple layers, including substrates and the adhesion, nucleation, transition layers for promoting the growth of the compound semiconductor epitaxial layers on substrates. The materials of the substrates in region 25 include but not limit to GaN, silicon (Si), sapphire, silicon carbide (SiC), diamond, zinc oxide, aluminum nitride (AlN), graphene, etc. The materials of the transition layers in the said region 25 can be compound semiconductors, including but not limiting to binary III-V materials such as AlN or GaN, ternary III-V materials such as InGaN and AlGaN, and quaternary III-V materials such as AlInGaN. In some embodiments, the transition layers in region 25 can be superlattice structure and compositionally-graded layers.

Figure 4:
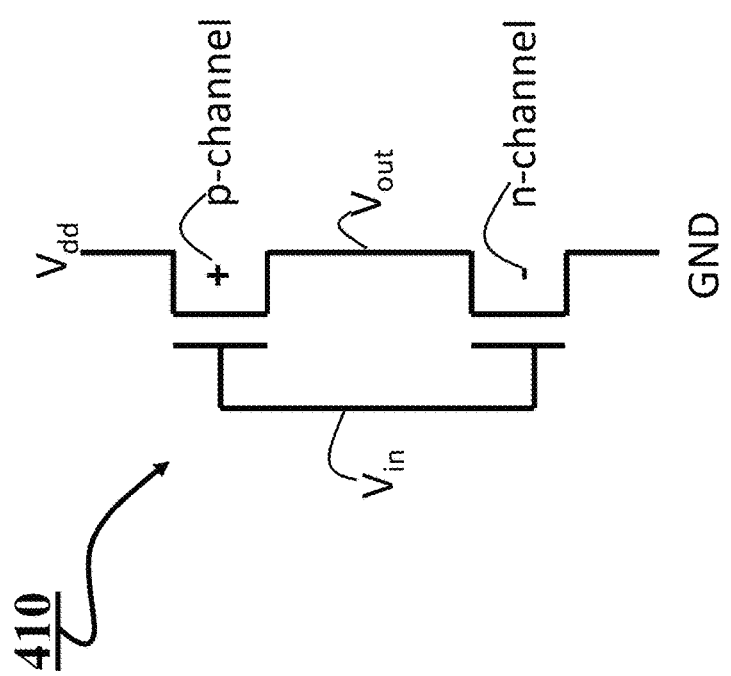
FIG. 4 is a schematic of a semiconductor device representing an equivalent of the complementary logic inverter.
Figure 5:
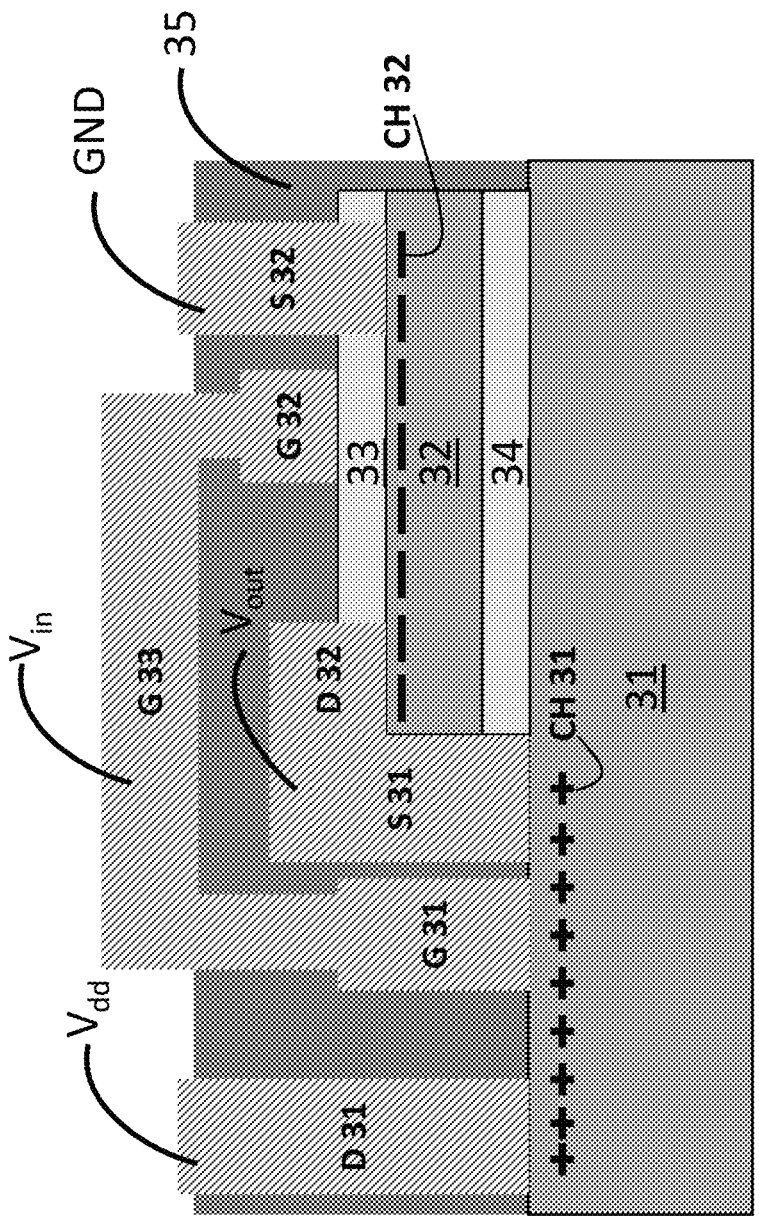
FIG. 5 and FIG. 6 are cross-sectional diagrams of two embodiments corresponding to the equivalent circuit of FIG. 4.
Figure 6:
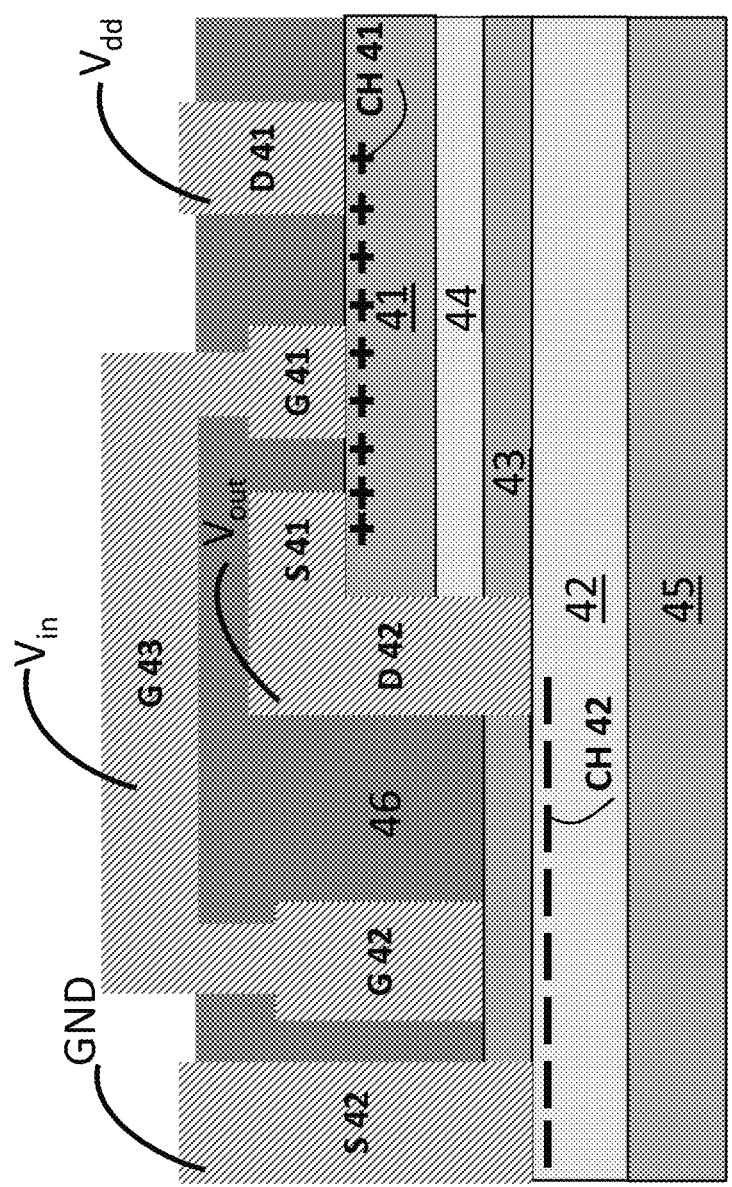

Various embodiments use different interconnection of the electrodes to connect the p-channel and the n-channel to form different examples of the monolithic integration of 2DEG channels and 2DHG channels suitable for different applications. An exemplar embodiment of a complementary logic inverter is shown in FIGS. 4, 5 and 6. Specifically, FIG. 4 shows a schematic of a semiconductor device 410 representing the equivalent 410 of the complementary logic inverter and FIGS. 5 and 6 shows cross-sectional diagrams of two embodiments corresponding to the equivalent circuit 410.

The semiconductor device 410 includes a p-channel and an n-channel, corresponding to the channels CH 31 and CH 32 in FIG. 5 and the channels CH 41 and CH 42 in FIG. 6. The gates of the p-channel and the said n-channel are connected, i.e., the gates G31 and G32 in FIG. 5 and the gates G41 and G42 in FIG. 6, to an input voltage ($V_{in}$). The source of the said p-channel, i.e., S31 in FIG. 5 and S41 in FIG. 6, and the drain of the n-channel, i.e., D31 in FIG. 5 and D41 in FIG. 6, are connected to an output voltage ($V_{out}$). The drain of the p-channel D31 in FIG. 5 or D41 in FIG. 6 is connected to a DC voltage $V_{dd}$. The source of the n-channel S32 in FIG. 5 or S42 in FIG. 6 is grounded (GND).

Referring to FIG. 5, the regions 31-34 can be formed in a way similar to the regions 11-14 in the embodiment shown in FIG. 2. Referring FIG. 6, the regions 41-45 are the same with the regions 21-25 in the embodiment shown in FIG. 3. Region 35 in FIG. 5 and region 46 in FIG. 6 can include a single or multiple insulating layers, with the materials including but not limiting to $Al_2O_3$, $SiO_2$, AlN, $SiN_x$, nanocrystalline diamond, and $HfO_2$.

In some embodiments, the gate stacks for the p-channel and n-channel can be either depletion-mode (D-mode) or enhancement-mode (E-mode). When a desired high voltage is applied to $V_{in}$, the n-channel can be turned ON with the p-channel turned OFF, inducing a low voltage in $V_{out}$. When a desired low voltage is applied to $V_{in}$, the n-channel can be turned off with the said p-channel turned on, inducing a high voltage in $V_{out}$. Thus, in this specific embodiment, a signal having an opposite level to the input signal can be output, forming a complementary logic inverter.

Figure 7:
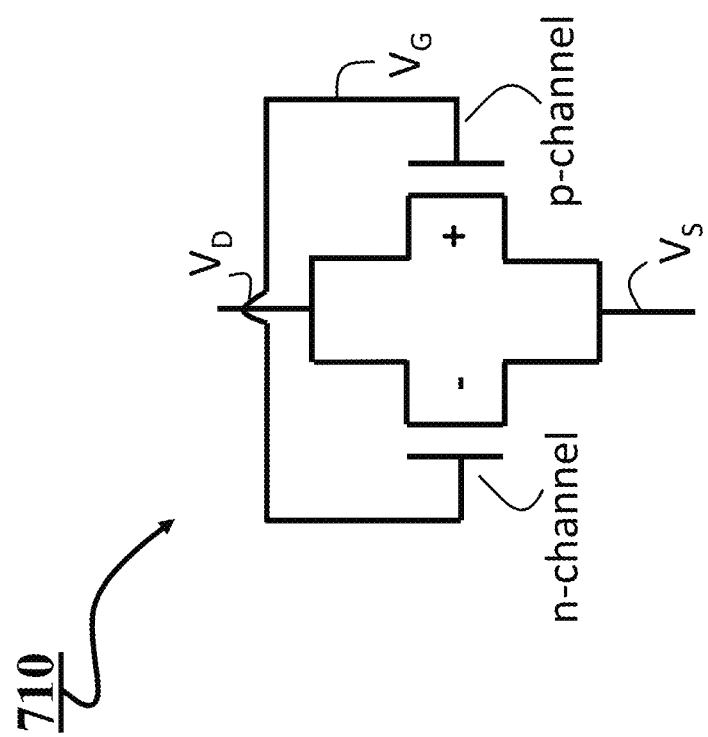
FIG. 7 is a schematic of a semiconductor device representing a current-bidirectional two-quadrant switch.
Figure 8:
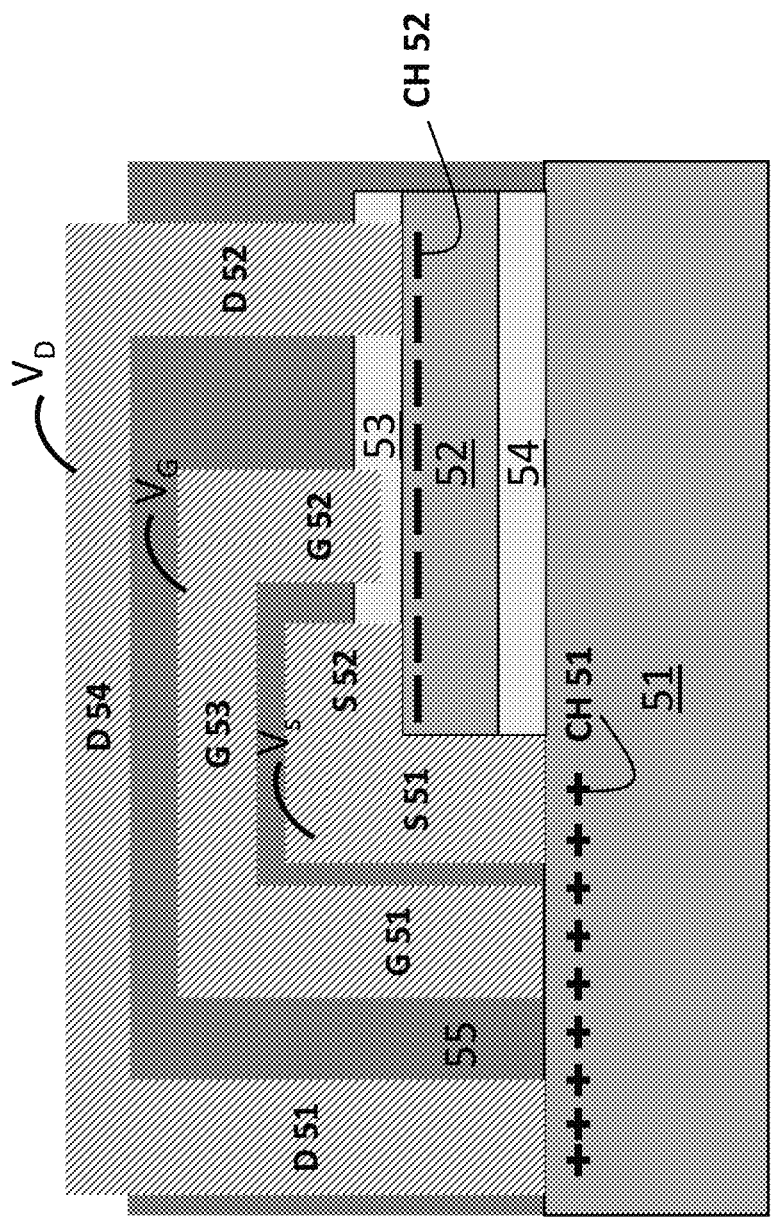
FIG. 8 and FIG. 9 are cross-sectional diagrams of two embodiments corresponding to the switch of FIG. 7.
Figure 9:
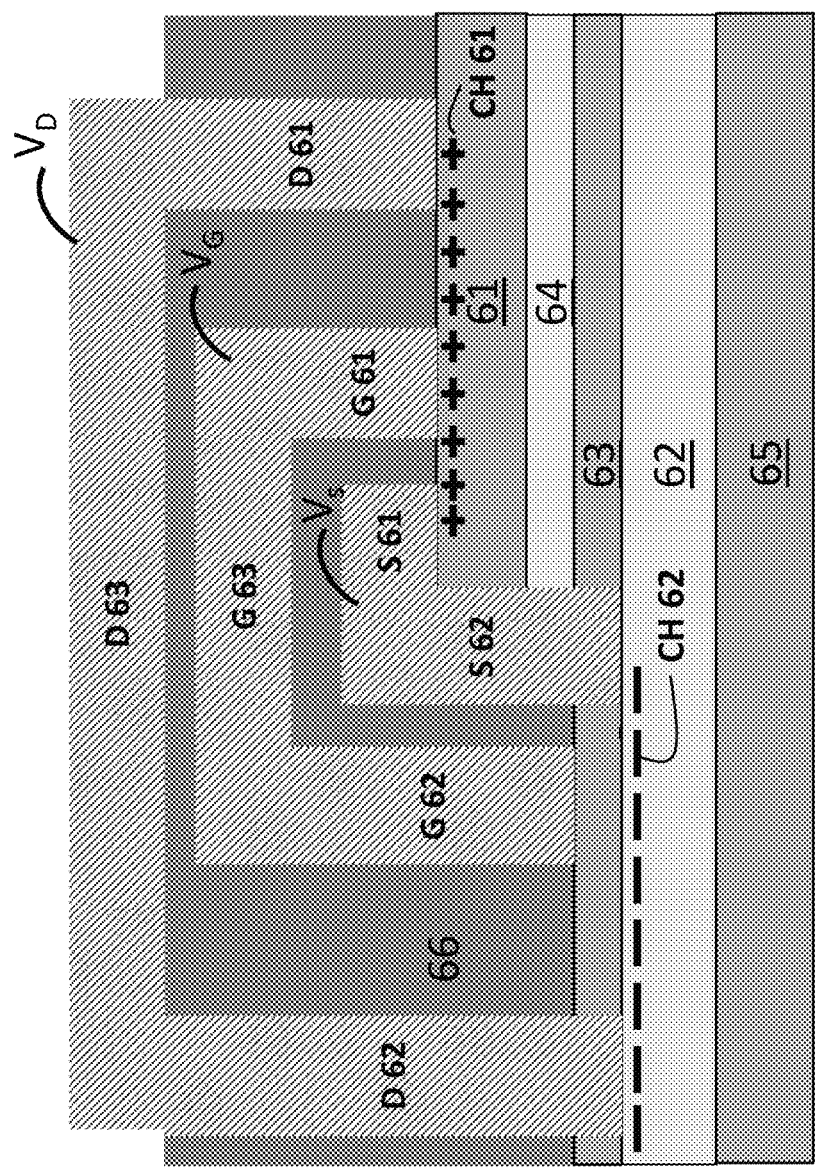

FIGS. 7, 8 and 9 show another exemplar embodiment of a current-bidirectional two-quadrant switch. FIG. 7 shows the equivalent circuit of the semiconductor device 710 and FIG. 8 and FIG. 9 show cross-sectional diagrams of different embodiments of the device 710.

The semiconductor device 710 includes a p-channel and an n-channel, corresponding to the channels CH 51 and CH 52 in FIG. 8 and the channels CH 61 and CH 62 in FIG. 9. The gates of the p-channel and the said n-channel are connected, i.e., the gates G51 and G52 in FIG. 8 and the gates G61 and G62 in FIG. 9, to an voltage $V_G$. The sources of the p-channel and the said n-channel are connected, i.e., the sources S51 and S52 in FIG. 8 and the sources S61 and S62 in FIG. 9, to an voltage $V_S$. The drains of the p-channel and the said n-channel are connected, i.e., the drains D51 and D52 in FIG. 8 and the drains D61 and D62 in FIG. 9, to a voltage $V_D$. Referring FIG. 8, the regions 51-54 can be formed in a way similar to the regions 11-14 in the embodiment shown in FIG. 2. Referring FIG. 9, the regions 61-65 can be formed in a way similar to the regions 21-25 in the embodiment shown in FIG. 3. Region 55 in FIG. 8 and region 66 in FIG. 9 can be formed in a way similar to the region 35 in FIG. 5 and region 45 in FIG. 6.

In some embodiments, the gate stacks for the p-channel and n-channel can be either depletion-mode (D-mode) or enhancement-mode (E-mode). In one embodiment, the $V_{th}$ of the p-channel is lower than the $V_{th}$ of the n-channel. When $V_G > V_{th}$-n-channel, the n-channel can be turned on with the p-channel turned off, allowing the current to flow through in a first direction (e.g. forward direction) through n-channel. When the $V_{th}$-p-channel$<V_G<V_{th}$-n-channel, the n-channel and the p-channel are turned off, with the whole device turned off and can sustain a voltage between $V_S$ and $V_D$. When $V_G<V_{th}$-p-channel, the said p-channel can be turned on with the said n-channel turned off, allowing the current to flow through in a second direction (e.g. reverse direction) though p-channel. Thus, the specific embodiment can allow a current-bidirectional switch.

The application of this embodiment includes a voltage source inverter, where switches block dc input voltage and conduct ac load current. Another possible application is in bidirectional battery charger/discharger, where switches should be able to turn off and conduct bidirectional current in the on-state. Another possible application is used as a switching configuration equivalent to a power transistor and a flyback diode in parallel (i.e. freewheeling diode, fast recovery diode), where the flyback diode can eliminate the sudden voltage spike seen across an inductive load when its supply voltages are suddenly reduced and removed.

Semiconductor Transistors with Common Electrodes for Multiple Channels

In the above-mentioned monolithic integration of the semiconductor device, the n-channel and the said p-channel are disposed in parallel and integrated by electrode interconnections. A tighter integration of the n-channel and the p-channel can be possible for the semiconductor transistors, such that the n-channel and the p-channel are disposed overlapping each other and sharing all three electrodes.

Figure 10:
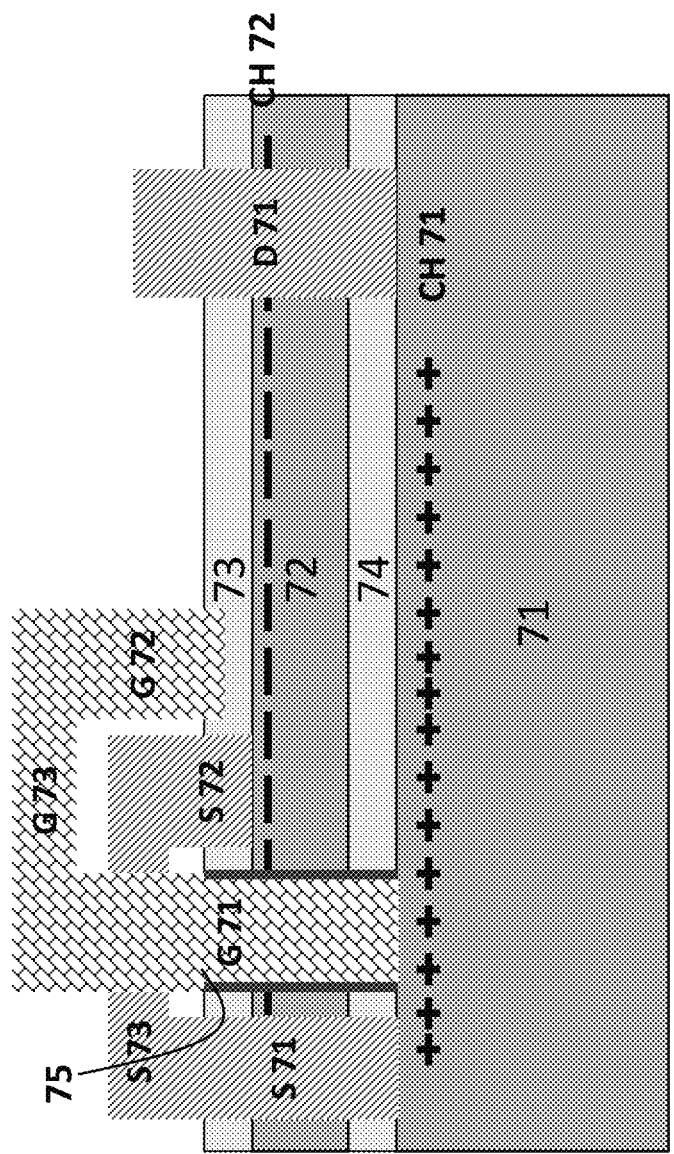
FIG. 10 is a cross-sectional diagram of a semiconductor device according to one embodiment of the invention.

FIG. 10 shows a cross-sectional diagram of a semiconductor device according to one embodiment of the invention. The semiconductor device includes an overlapping pair of p-channel and n-channel, namely CH 71 and CH 72. The regions 71-74 can have the same structure as the regions 11-14. The gate stack has two gate fingers G71 and G72, each finger with different length to reach the corresponding channel CH 71 or CH 72. The gate finger G71 and G72 are connected by a gate pad G73 and can form either D-mode or E-mode gate stack for each channel. Dielectric layer 75 can be deposited all-around the sidewall of gate finger G71 for isolation between gate finger G71 and channel CH 72.

The source stack has two source fingers S71 and S72, each finger has different length to reach corresponding channel CH 71 or CH 72, forming or partially forming an Ohmic contact with each channel. The source fingers S71 and S72 are connected by a source pad S73. A common drain electrode can be formed to access the said channels CH 71 and CH 72.

Figure 11:
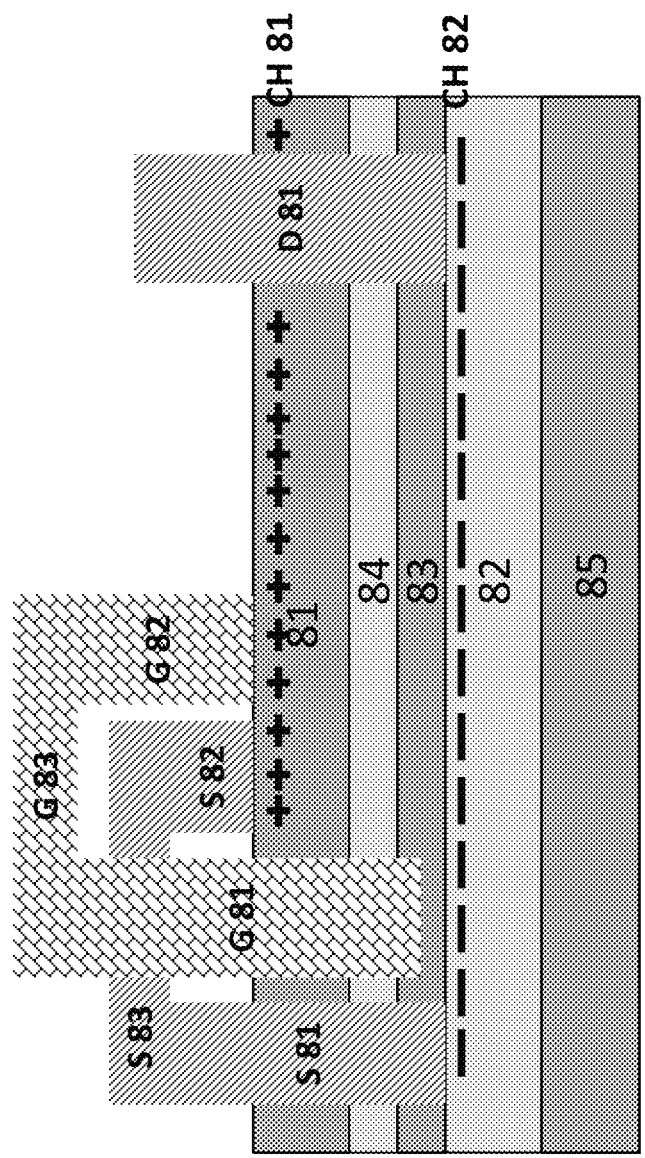
FIG. 11 is a cross-sectional diagram of a semiconductor device according to another embodiment of the invention, where the n-channel is disposed below the p-channel.

FIG. 11 shows a cross-sectional diagram of a semiconductor device according to another embodiment of the invention, where the n-channel is disposed below the p-channel. The regions 81-85 can have the same structure as the regions 21-25. The multi-finger electrodes S81-83, G81-83 and D81 are the same with the multi-finger electrodes S71-73, G71-73 and D71 shown in FIG. 10.

Figure 12:
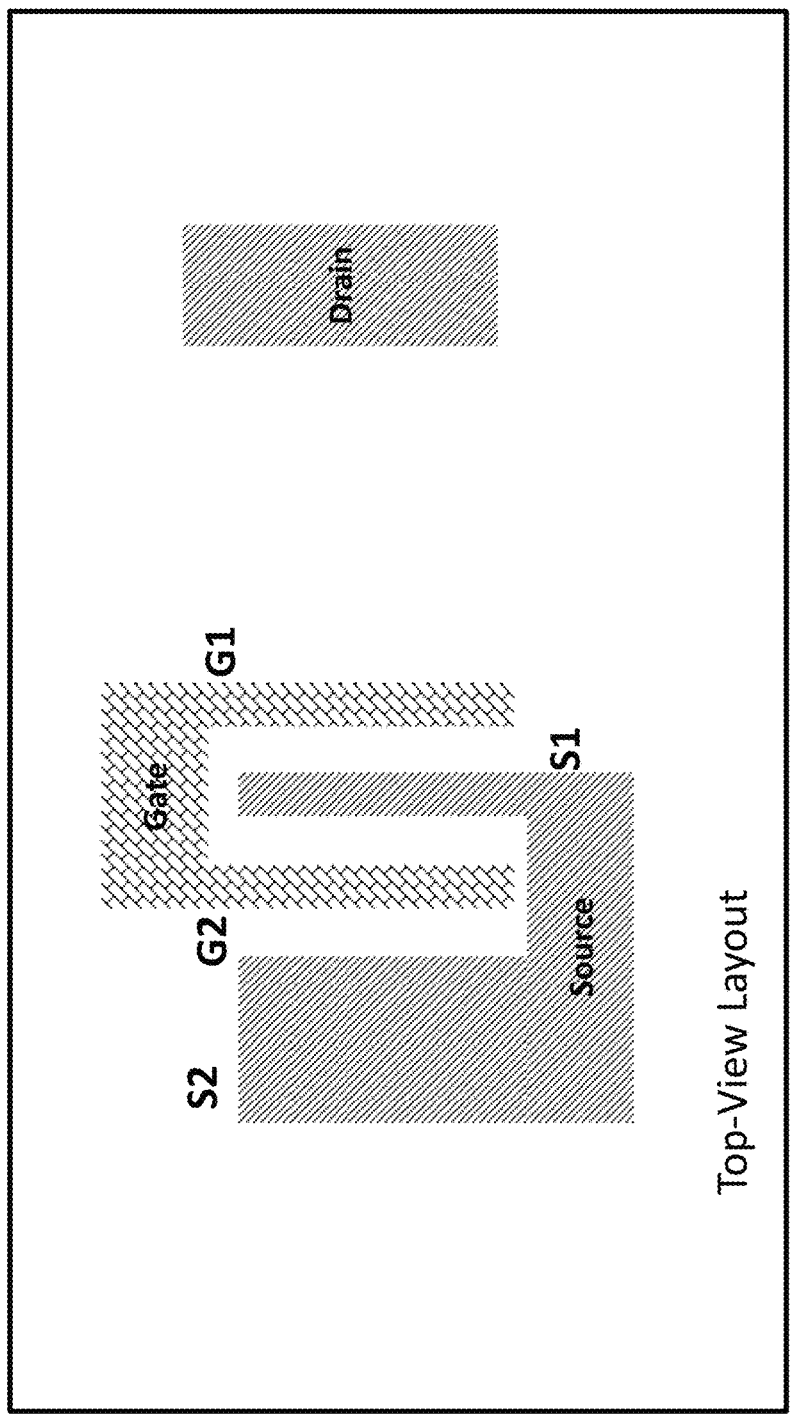
FIG. 12 is a top-view diagram showing geometry and arrangement of the electrodes of the device in FIG. 10 and/or FIG. 11.

FIG. 12 shows a top-view diagram showing geometry and arrangement of the electrodes of the device in FIG. 10 and FIG. 11. As shown, the gate fingers and source fingers are interdigitated, with a gate pad and source pad connecting multiple source and gate fingers. With this electrode configuration, the channel width is equal to that of interdigitated gate/source fingers. In some embodiments, the source electrode and the drain electrode can be interchanged, and the gate fingers interdigitate with the drain fingers.

Figure 13:
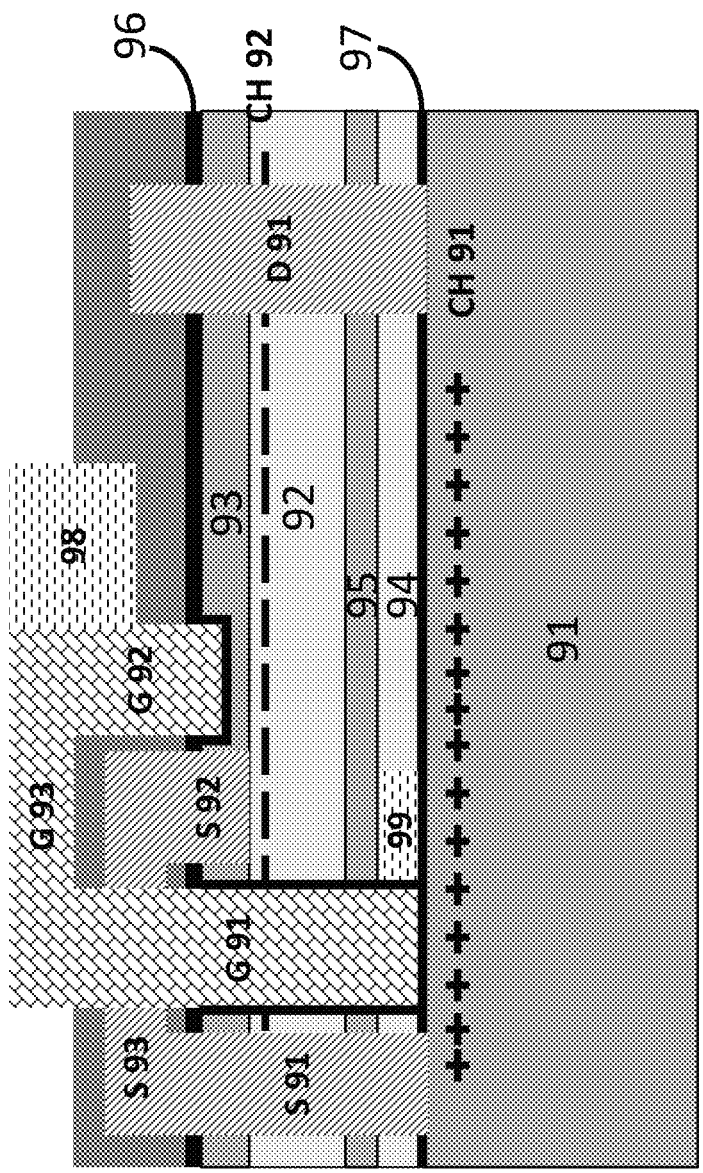
FIG. 13 is a diagram of a semiconductor transistor according to one embodiment of the invention.

FIG. 13 shows a diagram of a semiconductor transistor with 2DEG & 2DHG channels, common electrodes for multiple channels, gate dielectrics, field plates and back-barriers according to one embodiment of the invention. In this embodiment, the gate dielectrics, field plates and back-barriers are added to address issues such as heat dissipation, electric field crowding and/or electron charge leaking of the semiconductor transistor. The regions 91-94 of the semiconductor transistor can have similar structure as the regions 71-74.

In some embodiments, semiconductor regions 95 serve as back-barriers to enhance the electron/hole confinement in the channel. In these embodiments, the materials of the regions 95 can have a larger bandgap than the layer 92. In some other embodiments, dielectric regions 96 and 97 can be disposed below or all-around the gate finger G91 and G92, to form a metal-insulator-semiconductor (MIS) or a MOS gate stack. The materials of regions 96 and 97 can include but is not limited to $SiO_2$, $Si_xN_y$, $Si_xO_y$, $Al_2O_3$, $HfO_2$, etc. In some other embodiments, the dielectric regions 96 and 97 are used as passivation layers to remove possible interface states between semiconductor layers. In some other embodiments, metal regions 98 and 99 can be disposed aside the said gate finger G91 and G92, forming field plate structures to spread the electric field in the device in the reverse bias.

Figure 14:
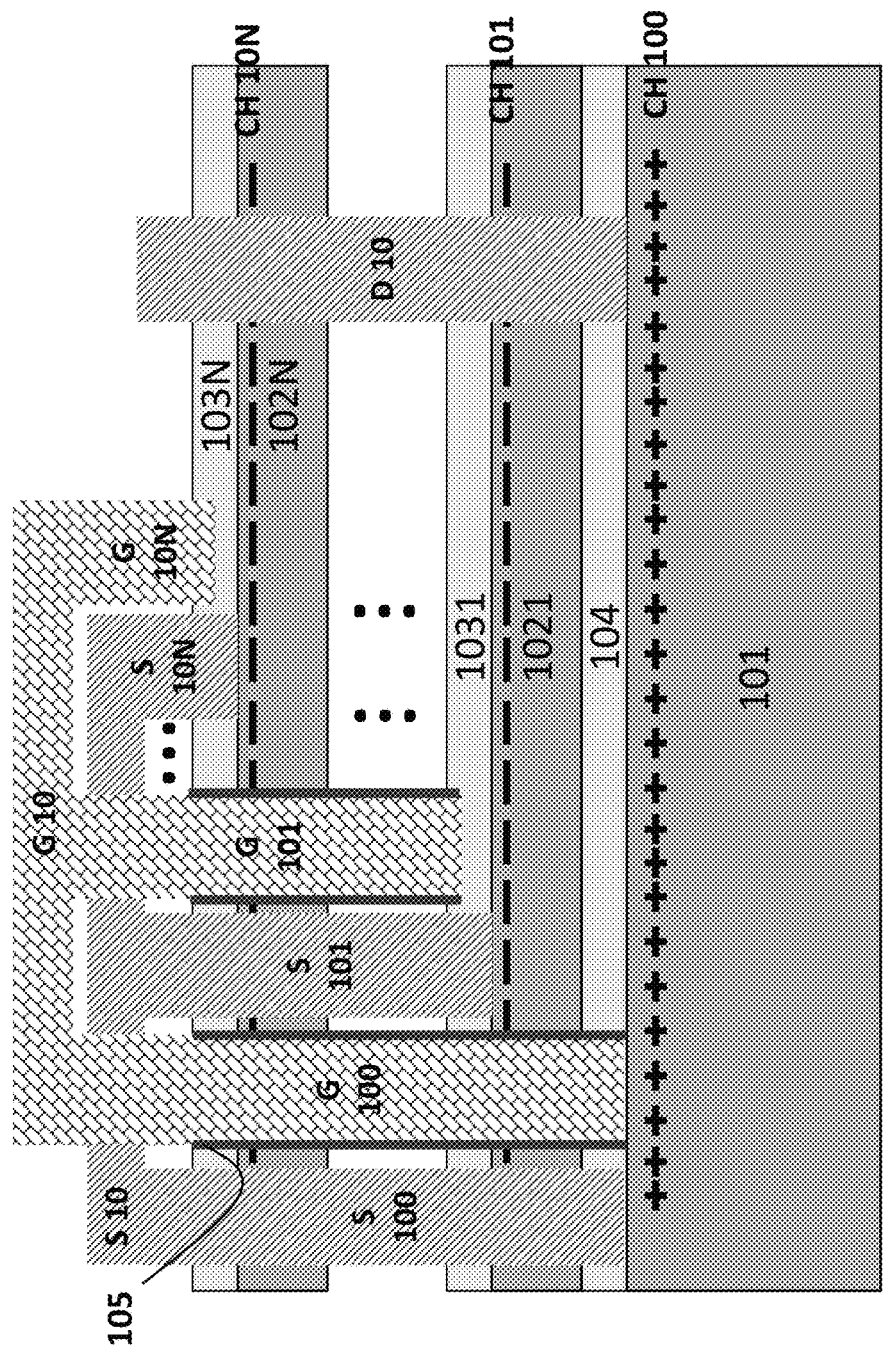
FIG. 14 is a cross-sectional diagram of a semiconductor transistor with multiple carrier channels and a common electrode for multiple carrier channels according to some embodiment of the invention.

FIG. 14 shows a cross-sectional diagram of a semiconductor transistor with multiple 2DEG & 2DHG channels and common electrodes for multiple channels according to some embodiment of the invention. In one embodiment, the semiconductor transistor includes a 2DHG channel CH 100 and multiple 2DHG channels CH 101, . . . CH 10N. The layers 1021 and 1031, 1022 and 1032 . . . 102N and 103N are the heterostructures forming 2DEG channels.

The gate stack has multiple gate fingers G100, G101, G102 . . . G10N, each finger with different lengths to reach multiple channels. The gate fingers G100, G101, G102 . . . G10N can form either a D-mode or an E-mode gate control over corresponding channels. The source stack has multiple source fingers S100, S101, S102 . . . S10N, each finger with different depths to reach multiple channels, forming or partially forming an Ohmic contact with different channels. A common drain electrode D10 can be formed to access multiple channels. Dielectric layer 105 can be deposited all-around the sidewall of gate fingers for isolation between gate finger and carrier channels.

Figure 15:
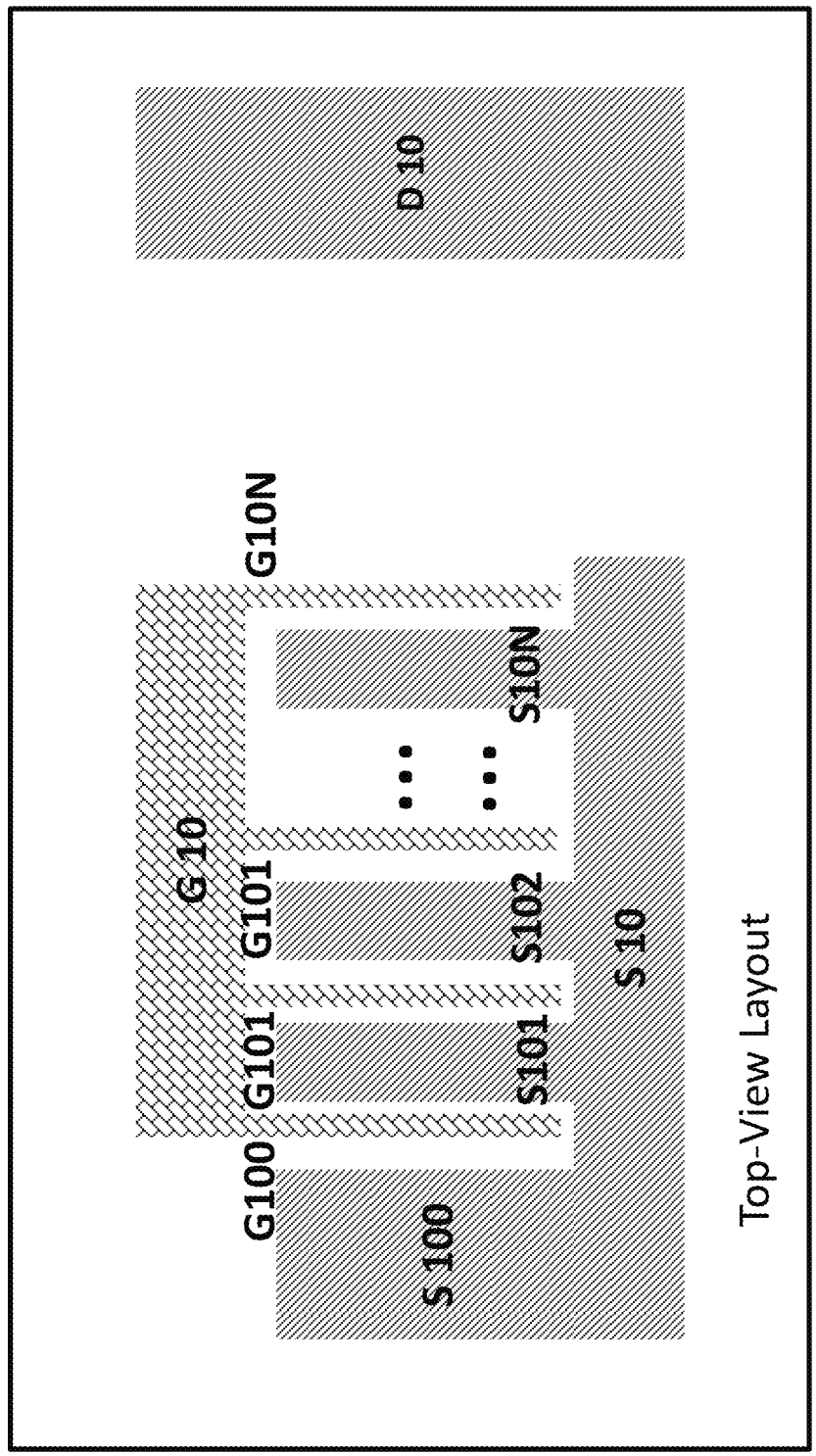
FIG. 15 is a top-view diagram of the geometry and arrangement of the electrodes the transistor of FIG. 14.

FIG. 15 shows a top-view diagram of the geometry and arrangement of the said electrodes the transistor of FIG. 14. As shown, the gate fingers and source fingers are interdigitated, with a large gate pad and source pad connecting multiple source and gate fingers. With this electrode configuration, the channel width is equal to that of interdigitated gate/source fingers. In some embodiments, the source electrode and the said drain electrode can be interchanged, and the said gate fingers would interdigitate with the said drain fingers.

Figure 16:
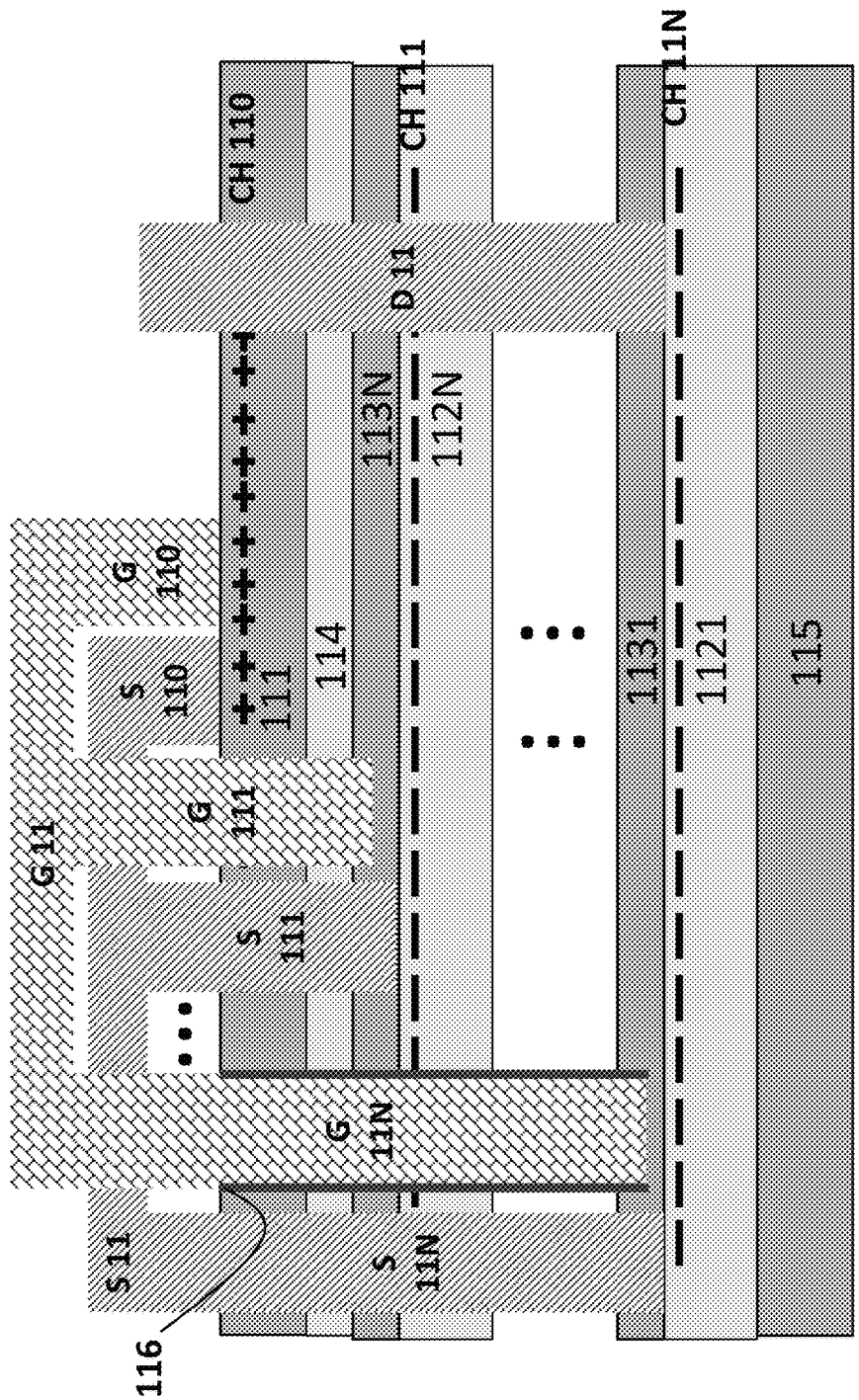
FIG. 16 is a cross-sectional diagram of a semiconductor transistor according to another embodiment of the invention.

FIG. 16 shows a cross-sectional diagram of a semiconductor transistor according to another embodiment of the invention. In the embodiment, with a 2DHG channel CH110 is arranged above multiple 2DHG channels CH 111, . . . CH 11N. The regions 111 and 115 can have the same structure as the regions 21 and 25. Regions 1121-112N and regions 1131-113N can have the same structure as the regions 1021-102N and regions 1031-103N in the embodiment shown in FIG. 14. Electrodes G110-11N, S110-11N and D11 can have the same structure with the electrodes G100-10N, S100-10N and D10 in the embodiment shown in FIG. 14. Gate dielectric layer 116 is similar to the layer 105 in the embodiment shown in FIG. 14.

In some embodiments, gate dielectrics, field plates and back-barriers are added to the semiconductor devices shown in FIGS. 14-16. In some other embodiments of the semiconductor transistors with multiple 2DEG & 2DHG channels, a different electrodes configuration can be adopted.

Figure 17:
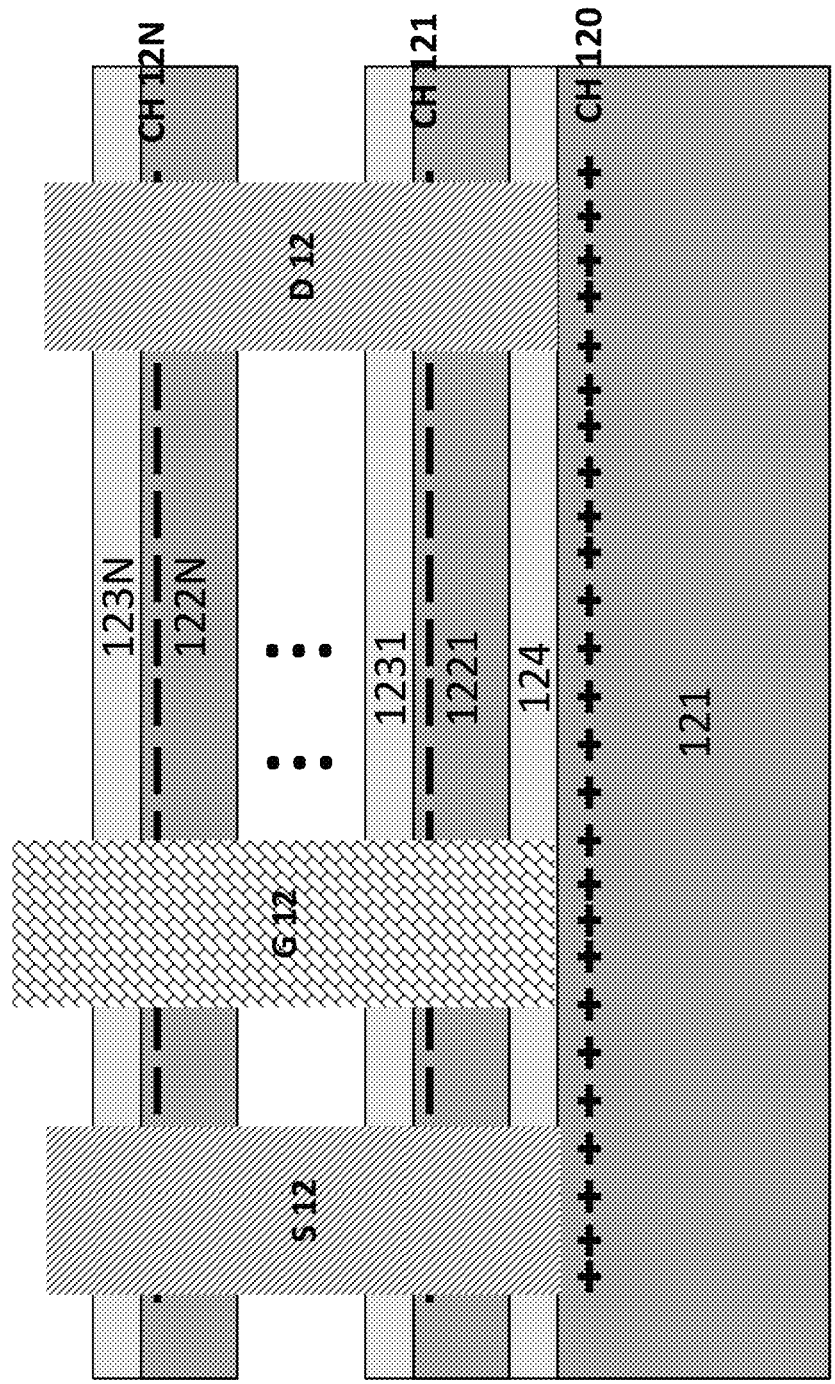
FIG. 17 is a cross-sectional diagram of a semiconductor transistor according to another embodiment of the invention.

FIG. 17 shows a cross-sectional diagram of a semiconductor transistor according to another embodiment of the invention. The semiconductor transistor of this embodiment includes a 2DHG channel and multiple 2DEG channels, namely channels CH 120, CH 121, . . . CH 12N. The heterostructures 1221 and 1231, 1222 and 1232 . . . 122N and 123N are the same with the heterostructures 1021 and 1031, 1022 and 1032 . . . 102N and 103N.

Figure 18:
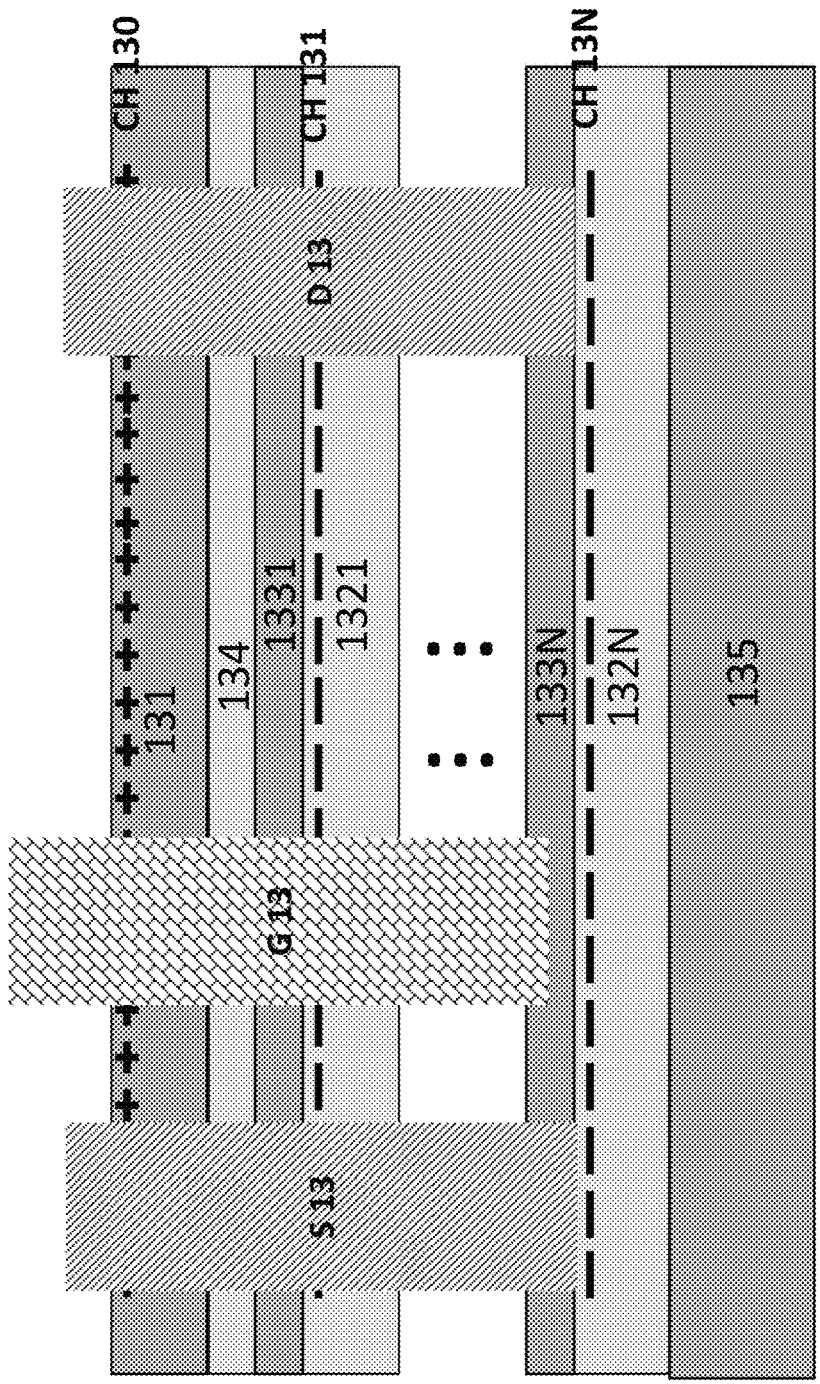
FIG. 18 is a cross-sectional diagram of a semiconductor transistor according to another embodiment of the invention.

FIG. 18 shows a cross-sectional diagram of a semiconductor transistor according to another embodiment of the invention. The semiconductor transistor of this embodiment includes a 2DHG channel CH 130 on top of multiple 2DEG channels CH 131 . . . CH 13N, with the same wafer structures with the structures in the embodiment shown in FIG. 17.

Figure 19:
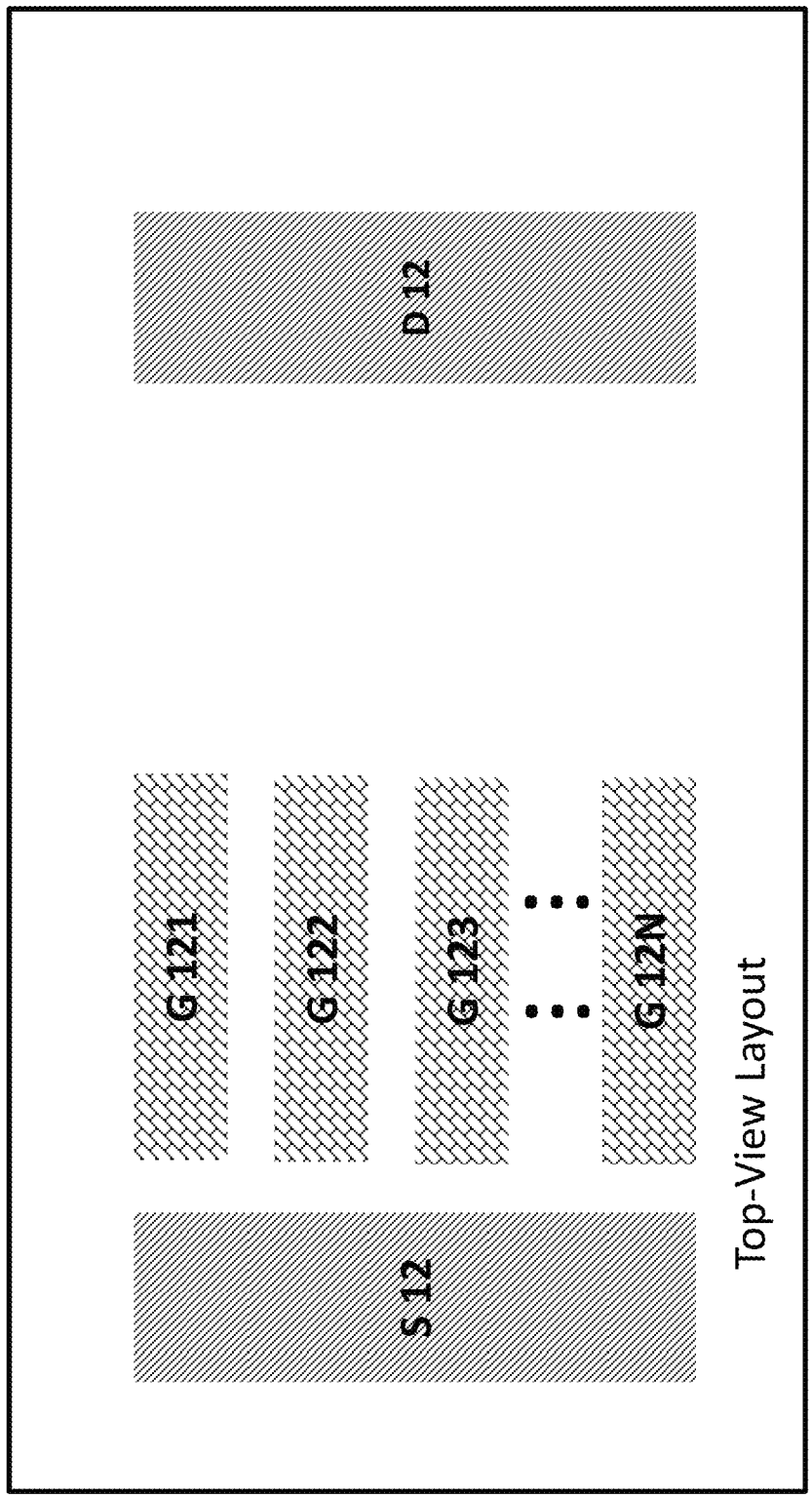
FIG. 19 is a top-view diagram of semiconductor transistors of FIGS. 17 and 18.

FIG. 19 shows a top-view diagram of semiconductor transistors of FIGS. 17 and 18. The transistors include a plurality of spaced apart gate structures deeply etched to access the channel on the lowest level, with a common source and a common drain for all channels. In the on-state, all multi-channels can conduct current via the regions between the spaced apart gates. In the off-state, the spaced apart gate not only vertically depleted the carriers in the bottom channel, but also laterally depletes the 2DEGs or 2DHGs in other upper-level channels between two gates. This electrode configuration, although does not take full advantage of gate width, can be easier for fabrication.

Semiconductor Diodes with 2DEG Channels and 2DHG Channels

Figure 20:
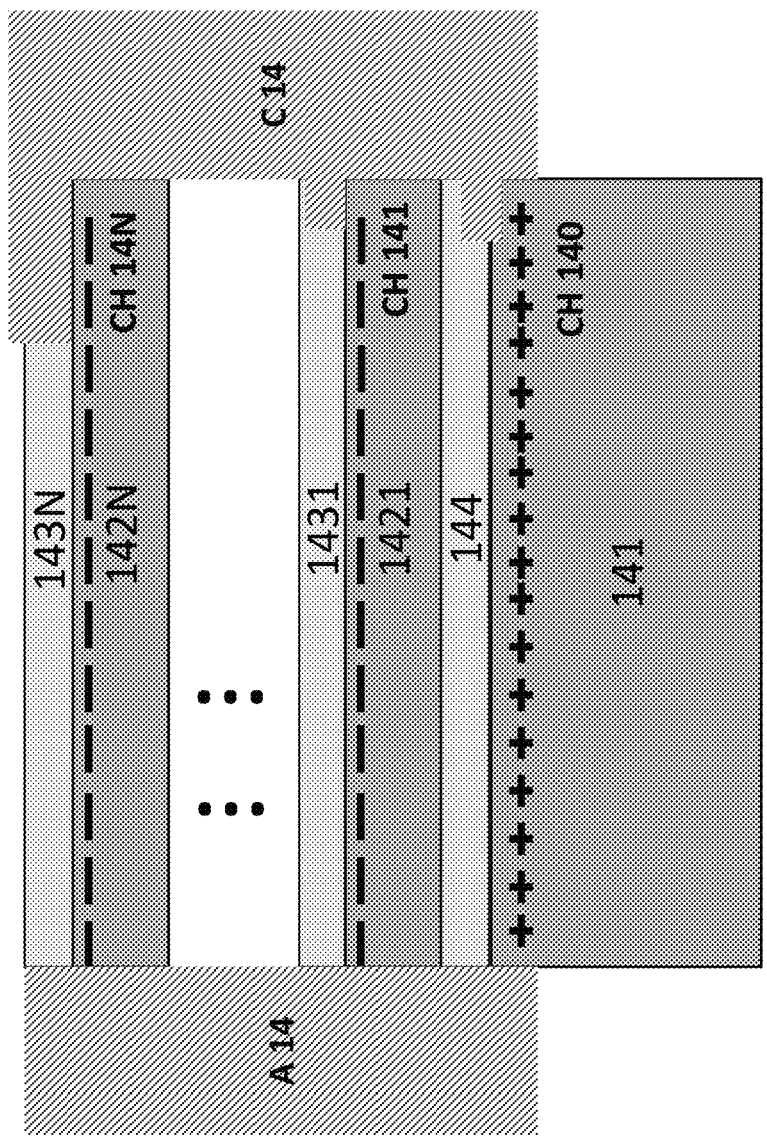
FIG. 20 and FIG. 21 are diagrams of a two-terminal semiconductor device according to different embodiments of the invention.
Figure 21:
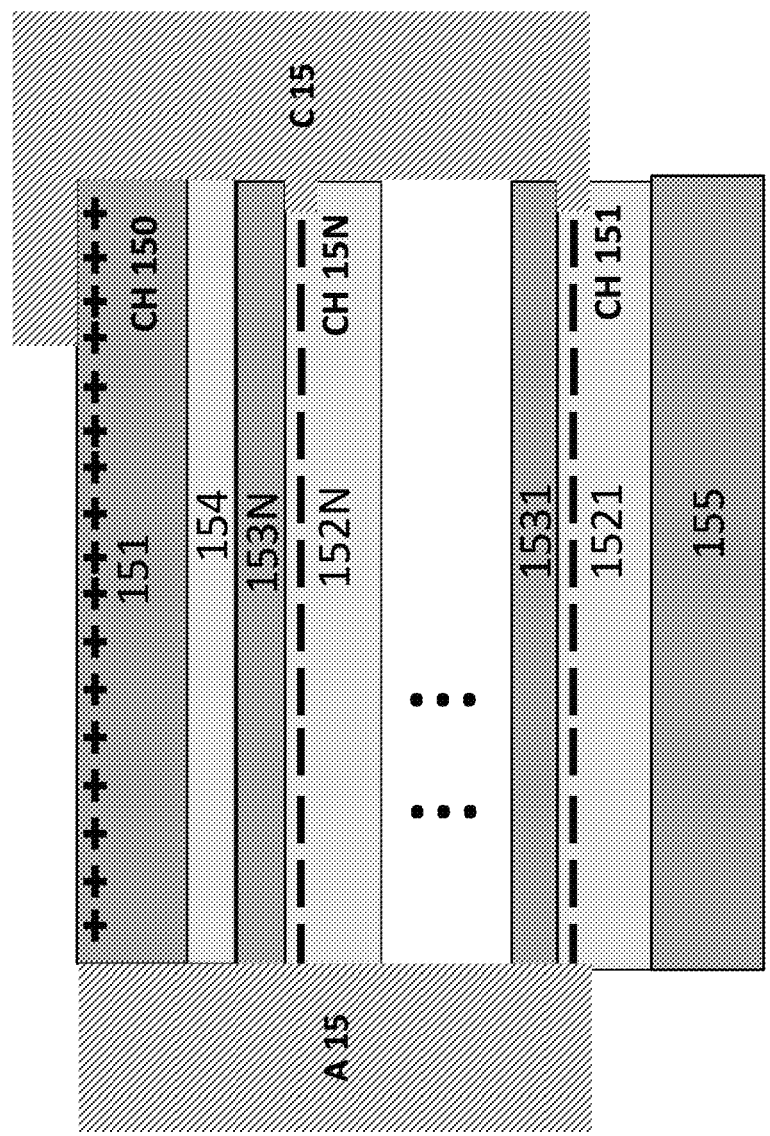

Multiple 2DEG channels and diamond 2DHG channels can also be integrated in two-terminal devices, such as diodes. Two specific embodiments incorporating multiple 2DEG channels and diamond 2DHG channels are shown in FIG. 20 and FIG. 21. Diamond region 141 in FIG. 20 and region 151 in FIG. 21 can be p-type doped. The diamond 2DHG channel and multiple 2DEG channels in FIG. 20 and FIG. 21 are the same with the multiple 2DHG and 2DEG channels in the embodiments shown in FIGS. 17-22. The contact A14 in FIG. 20 and A15 in FIG. 21 can be either Ohmic contact or Schottky contact, or a combination. The contact C14 in FIG. 20 and C15 in FIG. 21 can preferably be an Ohmic contact with access to multiple 2DEG and 2DHG channels.

The incorporation of single or multiple diamond 2DHG channels with multiple 2DEG channels would bring two benefits: (a) an increase in current density; (b) a potential formation of a super junction structure. In some embodiments, the diamond regions are p-type doped and the heterostructure are intentionally or intrinsically n-type doped, forming a single or multiple p-n junctions vertically. In these embodiments, the multiple p-n junctions cause full depletion of the super junction structure at a small reverse bias. Further reverse voltages are supported by the fully depleted super junction with almost uniform distribution of electric field. In comparison to the typical triangle electric field distribution in conventional multi-channel diodes, the uniform distribution of electric field would enable a higher breakdown voltage for the multiple channel diodes with p-diamond 2DHG channels.

Fabrication Method

Figure 22:
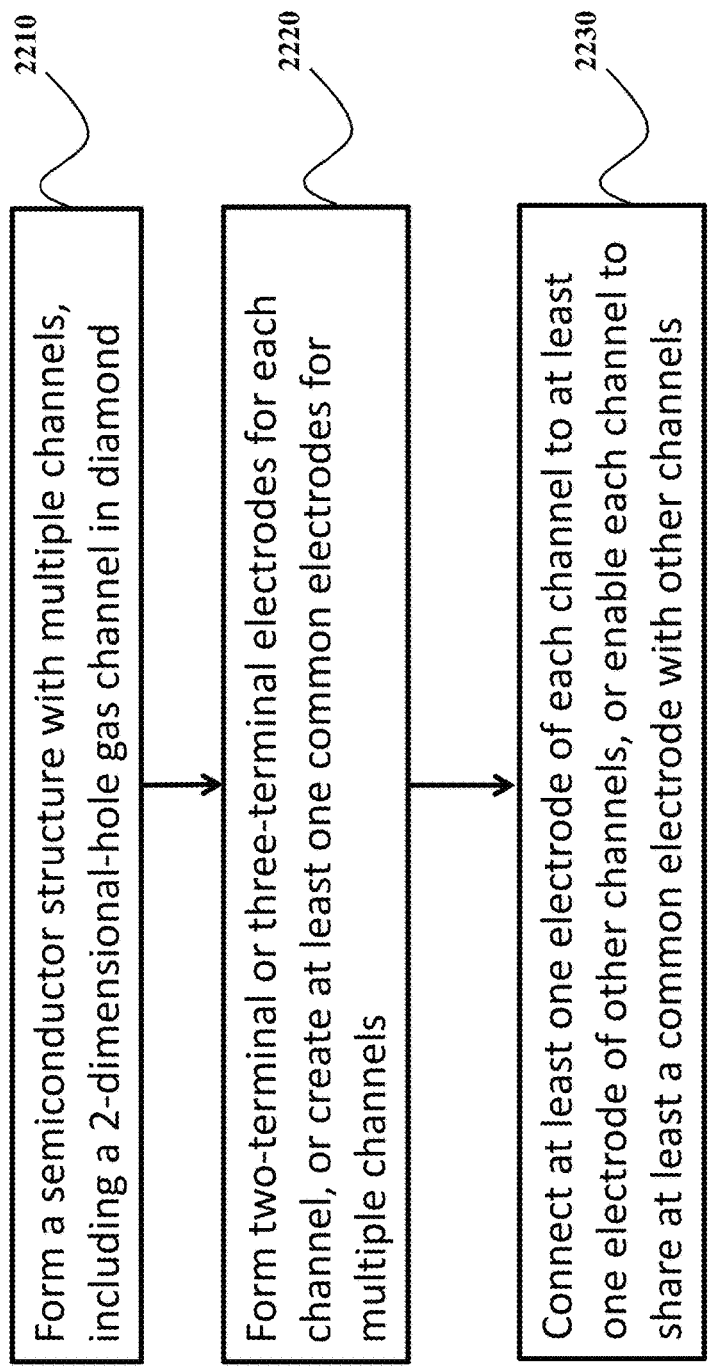
FIG. 22 is a block diagram of a method for making a semiconductor device according to some embodiments of the invention.

FIG. 22 shows a block diagram of a method for making a semiconductor device according to some embodiments of the invention. The method forms 2210 a semiconductor structure with multi-channels, including a diamond 2DHG channels. In some embodiments, the step 2210 can be performed by growth of diamond substrates, epitaxial layers and films, with the methods including but not limiting to a Chemical Vapor Deposition (CVD), Metal-Organic Chemical Vapor Deposition (MOCVD), a Molecular Beam Epitaxy (MBE), a Metal-Organic Vapor Phase Epitaxy (MOVPE), plasma-enhanced chemical vapor deposition (PECVD), microwave plasma deposition system etc. The grown diamond can be single-crystal, polycrystalline or nanocrystalline.

In alternative embodiment the semiconductor structure is formed 2210 by doping of diamond layers or regions. Either n-type doping or p-type doping can be involved with possible n-type dopants including but not limiting to nitrogen and phosphorus and possible p-type dopants including but not limiting to boron.

Additionally or alternatively, the formation of 2DHG channel in diamond can be done by surface hydrogenation and near-surface delta-doping. Some additional process can also be included, such as exposure of the H-diamond surface to high electron affinity materials, to improve 2DHG stability or increase 2DHG carrier concentration. In alternative embodiment, the formation 2210 can be performed using device active region isolation, with the methods such as surface oxygenation, etching and ion implantation.

Next, the method forms 2220 two-terminal electrodes and/or three-terminal electrodes for each n-channel or diamond 2DHG p-channel or the formation of common electrodes for multi-channels. In some embodiments, the step 2220 includes material removal procedure to expose the lower-level channels. In some embodiments, either physical or chemical methods can be used for material removal, including but not limiting to dry etch, wet etch, or a combination. Different ions for dry etching of diamond and other materials can be used, including but not limited to argon, fluorine, oxygen, hydrogen, nitrogen, chlorine and sulfur ions. In some specific embodiments, diamond layers can be etched using fluorine-based or chlorine-based plasma.

The step 2220 can also be performed using modulation of threshold voltage for n-channel or p-channel gate stacks. Various methods can be used for threshold voltage modulation, including but not limiting to (a) partially removing the channel layer in the gate region; (b) incorporation of positive or negative ions into the gate region; (c) inserting or doping n-type or p-type regions in the gate region.

The method also connects 2230 electrodes of n-channel and the diamond 2DHG p-channel, for specific device or circuit applications. In some embodiments, steps 2230 involves the formation of electrode interconnections, with the methods including but not limiting to ebeam deposition, joule evaporation, chemical vapor deposition or sputtering process. In some other embodiments, step 2230 involves the dielectric deposition for interconnection separation, electric field engineering or surface passivation. Various methods can be used for dielectric deposition, including but not limit to Atomic Layer Deposition (ALD), MOCVD, and PECVD.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A semiconductor device, comprising:
   a layered structure forming multiple carrier channels including at least one n-type channel formed in a first layer made of a first material and at least one p-type channel formed in a second layer made of a second material, wherein the first material is different than the second material; and
   a set of electrodes for providing and controlling carrier charge in the carrier channels, wherein the carrier channels extend in parallel at different depths of the semiconductor device, and wherein the set of electrodes comprises:
   a gate electrode having multiple gate fingers of different lengths penetrating the layered structure to reach and control corresponding carrier channels at the different depths; and
   a carrier electrode having multiple carrier fingers of different lengths penetrating the layered structure to access the corresponding carrier channels, wherein the carrier fingers are interdigitated with the gate fingers.

2. The semiconductor device of claim 1, wherein the second material includes diamond such that the p-type channel is a two-dimensional-hole gas (2DHG) channel formed with electrons of the diamond.

3. The semiconductor device of claim 2, wherein the first and the second materials are selected such that both types of channels have the switching frequency higher than 10 GHz and the maximum current higher than 100 mA/mm.

4. The semiconductor device of claim 1, wherein the first material and the second material include different combinations of compound semiconductors, silicon, germanium, organic semiconductors, diamond, carbon nanotube, graphene, molybdenum disulfide, boron nitride.

5. The semiconductor device of claim 1, wherein the n-type channel is formed by one or combination of a p-n junction, a metal-semiconductor structure, a metal-oxide-semiconductor structure, a tunneling structure, a surface quantum well and a heterostructure, and wherein the p-type channel is formed by one or combination of a surface hydrogenation and a delta-doping.

6. The semiconductor device of claim 1, wherein at least one electrode from the set of electrodes is a common electrode connected to all carrier channels.

7. The semiconductor device of claim 6, wherein the common electrode is a source electrode or a drain electrode for all carrier channels.

8. The semiconductor device of claim 6, wherein the common electrode is a source electrode for one carrier channel and a drain electrode for another carrier channel.

9. The semiconductor device of claim 6, wherein the common electrode is a gate electrode controlling carrier charges in the multiple carrier channels.

10. The semiconductor device of claim 6, wherein the common electrode is an anode electrode or a cathode electrode for all carrier channels.

11. A semiconductor device, comprising:
    a layered structure forming multiple carrier channels including at least one n-type channel formed in a first layer made of a first material including gallium nitride (GaN) or gallium arsenide (GaAs) such that the n-type channel is a two-dimensional-electron gas (2DEG) channel formed with electrons of the GaN or GaAs, and at least one p-type channel formed in a second layer made of a second material including diamond such that the p-type channel is a two-dimensional-hole gas (2DHG) channel formed with holes of the diamond; and a set of electrodes for providing and controlling carrier charge in the carrier channels, wherein the carrier channels extend in parallel at different depths of the semiconductor device, and wherein the set of electrodes comprises:

a gate electrode having multiple gate fingers of different lengths penetrating the layered structure to reach and control corresponding carrier channels at the different depths; and a carrier electrode having multiple carrier fingers of different lengths penetrating the layered structure to access the corresponding carrier channels, wherein the carrier fingers are interdigitated with the gate fingers.

12. The semiconductor device of claim 11, wherein at least one electrode from the set of electrodes is a common electrode connected to all 2DEG and 2DHG channels.

13. The semiconductor device of claim 12, further comprising:

at least one of a gate dielectric, a field plate and a back-barrier disposed at the layered structure.

14. A method for making a semiconductor device, comprising:

forming a layered structure with multiple carrier channels including at least one n-type channel formed in a first layer made of a first material including gallium nitride (GaN) or gallium arsenide (GaAs) such that the n-type channel is a two-dimensional-electron gas (2DEG) channel formed with electrons of the GaN or GaAs, and at least one p-type channel formed in a second layer made of a second material including diamond such that the p-type channel is a two-dimensional-hole gas (2DHG) channel formed with electrons of the diamond;

forming set of electrodes for providing and controlling carrier charge in the carrier channels; and connecting the electrodes such that at least one electrode from the set of electrodes is a common electrode connected to all carrier channels, wherein the carrier channels extend in parallel at different depths of the semiconductor device, wherein the set of electrodes includes a gate electrode having multiple gate fingers of different lengths penetrating the layered structure to reach and control corresponding carrier channels at the different depths and a carrier electrode having multiple carrier fingers of different lengths penetrating the layered structure to access the corresponding carrier channels, further comprising:

interdigitating the carrier fingers with the gate fingers; and disposing gate dielectrics at sidewalls of the gate fingers.

15. The method of claim 14, wherein the forming the layered structure comprises:

depositing or growing a diamond epitaxial layer, wherein the diamond epitaxial is a single-crystal, a polycrystalline or a nanocrystalline.

16. The method of claim 14, wherein the forming of the diamond 2DHG includes surface hydrogenation or delta-doping procedures.

17. The method of claim 15, further comprising:

doping the diamond with p-type dopants.

18. The method of claim 14, further comprising:

isolating the 2DHG channel with a surface oxygenation, a mesa etch or an ion implantation.

\* \* \* \* \*